(12) United States Patent
Kim et al.

(10) Patent No.: US 12,278,196 B2
(45) Date of Patent: Apr. 15, 2025

(54) SEMICONDUCTOR DEVICES AND METHODS OF MANUFACTURING SEMICONDUCTOR DEVICES

(71) Applicant: Amkor Technology Singapore Holding Pte. Ltd, Valley Point (SG)

(72) Inventors: Tae Ki Kim, Incheon (KR); Jae Beom Shim, Incheon (KR); Min Jae Yi, Gyeonggi-do (KR); Yi Seul Han, Incheon (KR); Young Ju Lee, Incheon (KR); Kyeong Tae Kim, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 18/385,667

(22) Filed: Oct. 31, 2023

(65) Prior Publication Data

US 2024/0063145 A1   Feb. 22, 2024

Related U.S. Application Data

(62) Division of application No. 17/015,147, filed on Sep. 9, 2020, now Pat. No. 11,830,823.

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............. H01L 21/4853; H01L 21/4857; H01L 21/4885; H01L 23/3128; H01L 23/5383; H01L 23/5386; H01L 23/49827; H01L 23/5384; H01L 23/49811; H01L 23/32; H01L 23/3121; H01L 23/49838–49844;
(Continued)

(56) References Cited

U.S. PATENT DOCUMENTS

| 10,192,837 | B1 | 1/2019 | Te et al. |
| 2013/0200528 | A1* | 8/2013 | Lin ................. H01L 24/97 |
| | | | 257/774 |

(Continued)

*Primary Examiner* — Victor A Mandala
*Assistant Examiner* — Lawrence C Tynes, Jr.
(74) *Attorney, Agent, or Firm* — Kevin B. Jackson

(57) ABSTRACT

An electronic device includes a substrate having a conductive structure with a substrate outward terminal at a second side of the substrate. A dielectric structure with an opening is adjacent to the second side. An electronic component is coupled to the substrate and an encapsulant encapsulates the electronic component. The substrate outward terminal comprises a multi-via terminal or a multi-stage via. The multi-via terminal includes pad conductive vias in the opening, a pad dielectric via interposed between the pad conductive vias, and a conductor comprising a conductor top side with micro dimples over the pad conductive vias and the pad dielectric via. The multi-stage terminal includes a pad base within the opening having a top side recessed below an upper surface the dielectric and a pad head coupled to the pad base within the opening, the pad head having a top side with a micro dimple.

20 Claims, 20 Drawing Sheets

(51) Int. Cl.
*H01L 21/56* (2006.01)
*H01L 23/16* (2006.01)
*H01L 23/31* (2006.01)
*H01L 23/538* (2006.01)
*H01L 23/552* (2006.01)

(52) U.S. Cl.
CPC ............ *H01L 21/565* (2013.01); *H01L 23/16* (2013.01); *H01L 23/3128* (2013.01); *H01L 23/5383* (2013.01); *H01L 23/5386* (2013.01); *H01L 23/552* (2013.01); *H01L 24/16* (2013.01); *H01L 2224/16227* (2013.01); *H01L 2924/3025* (2013.01); *H01L 2924/3512* (2013.01)

(58) Field of Classification Search
CPC ............... H01L 23/535; H01L 23/5385; H01L 23/49822; H01L 23/49833; H01L 24/16; H01L 2224/16227; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2224/02372; H01L 2224/023–024; H01L 2224/0165; H01L 2225/06548

See application file for complete search history.

(56) References Cited

U.S. PATENT DOCUMENTS

| 2016/0079135 A1* | 3/2016 | Huang | H01L 23/16 257/777 |
| 2016/0284654 A1* | 9/2016 | Yu | H01L 23/3192 |
| 2019/0103353 A1* | 4/2019 | Liu | H01L 25/0655 |
| 2021/0098421 A1* | 4/2021 | Wu | H01L 23/564 |

* cited by examiner

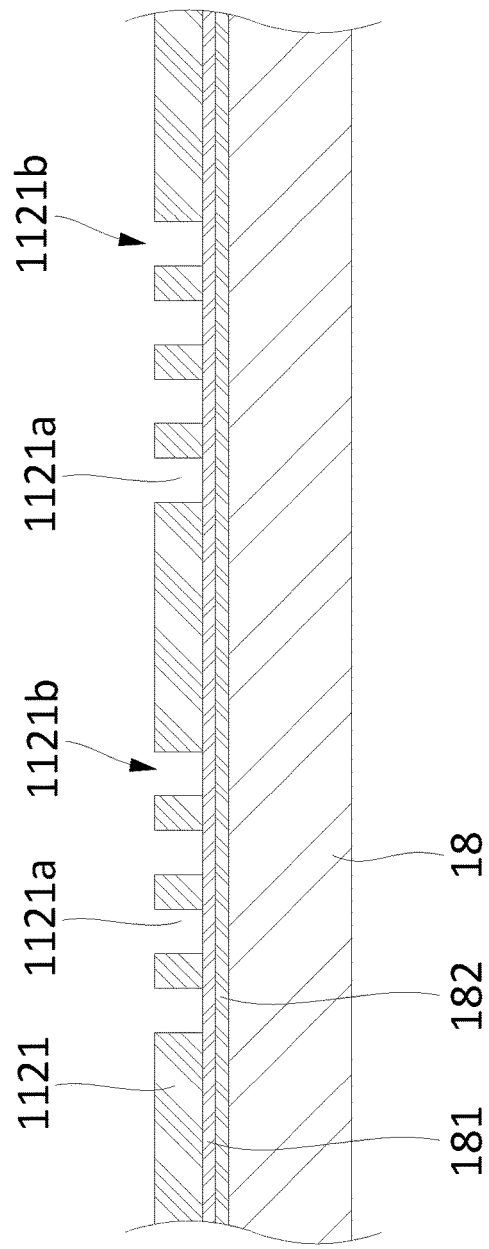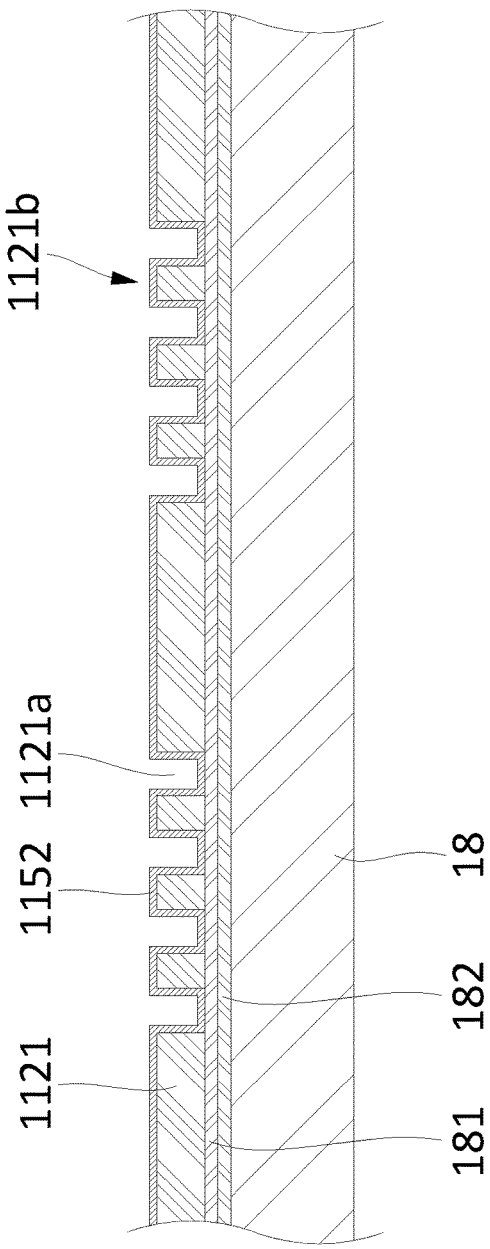

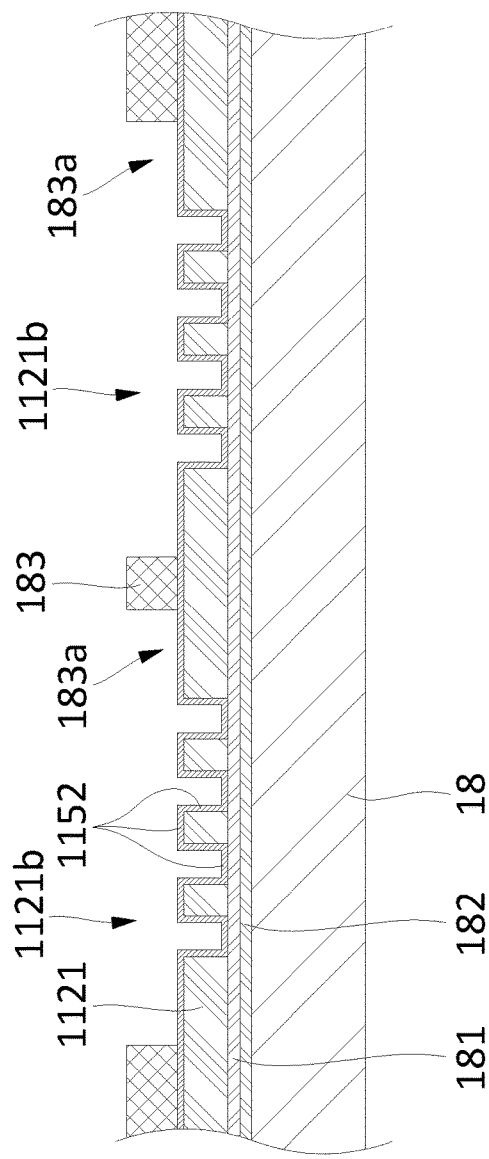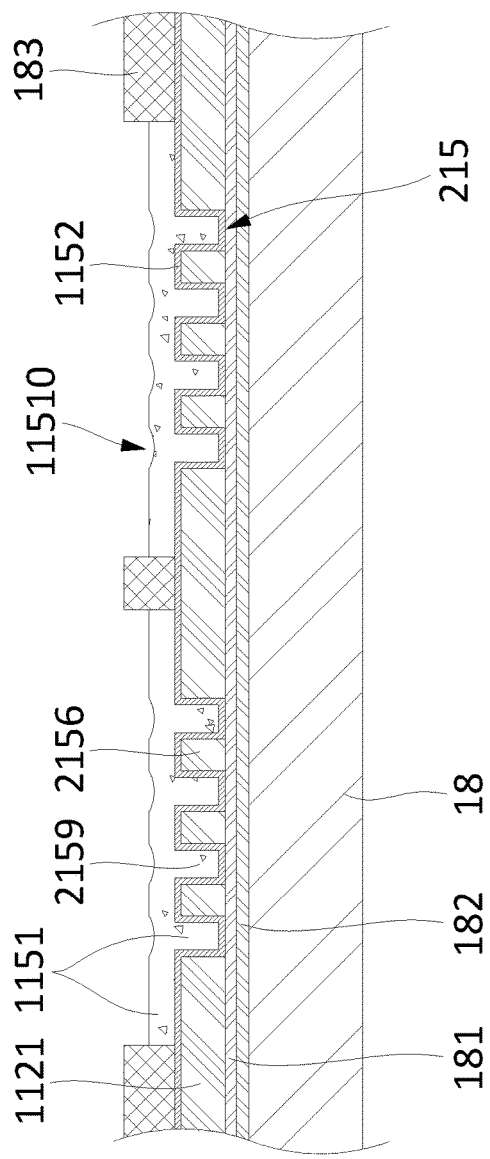

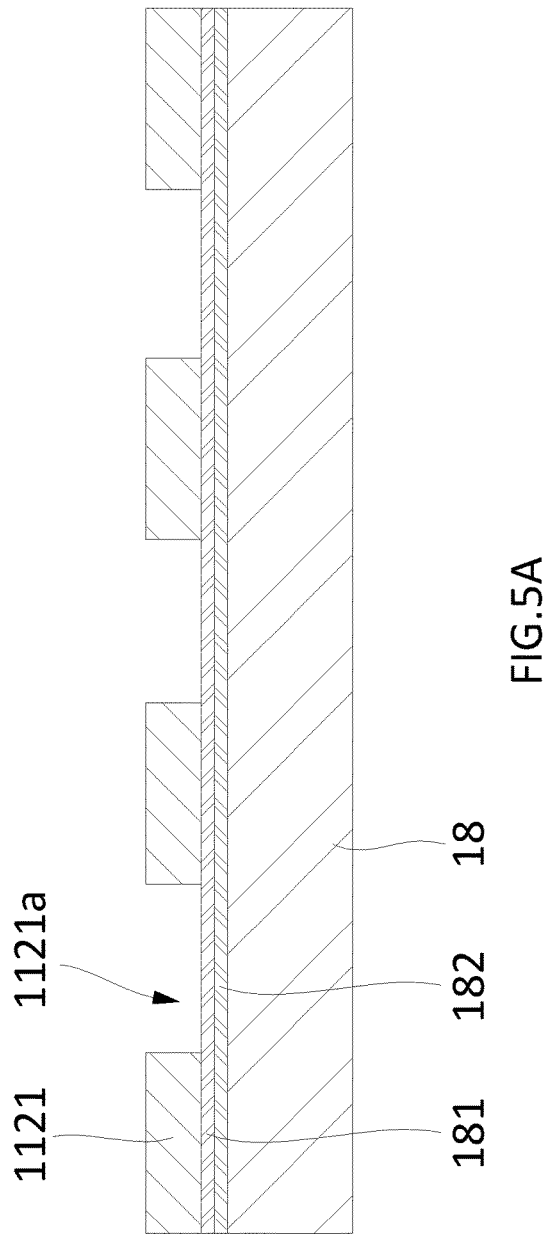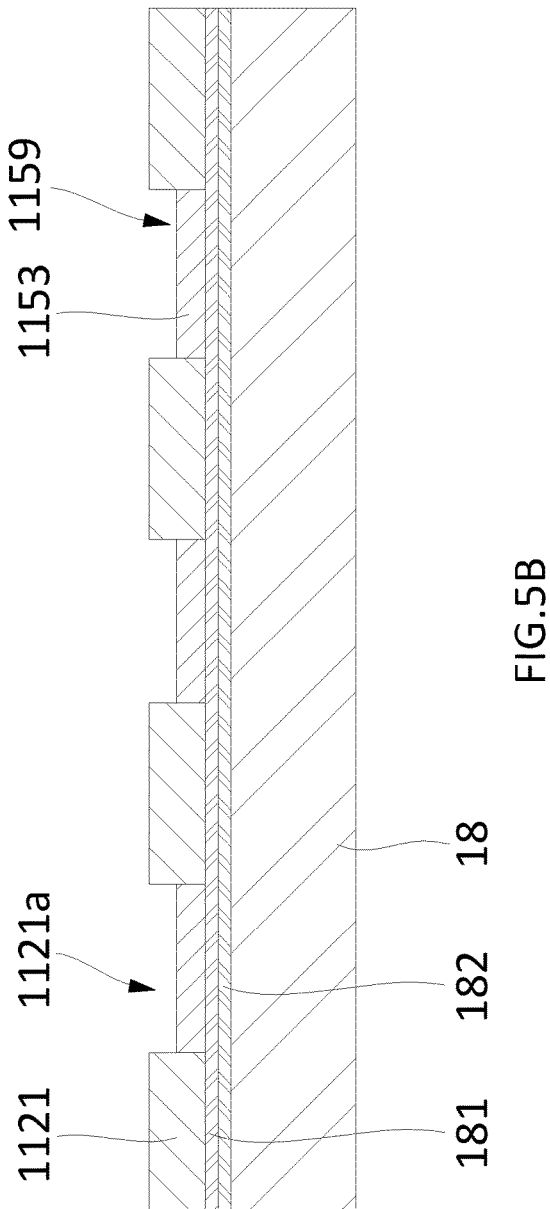

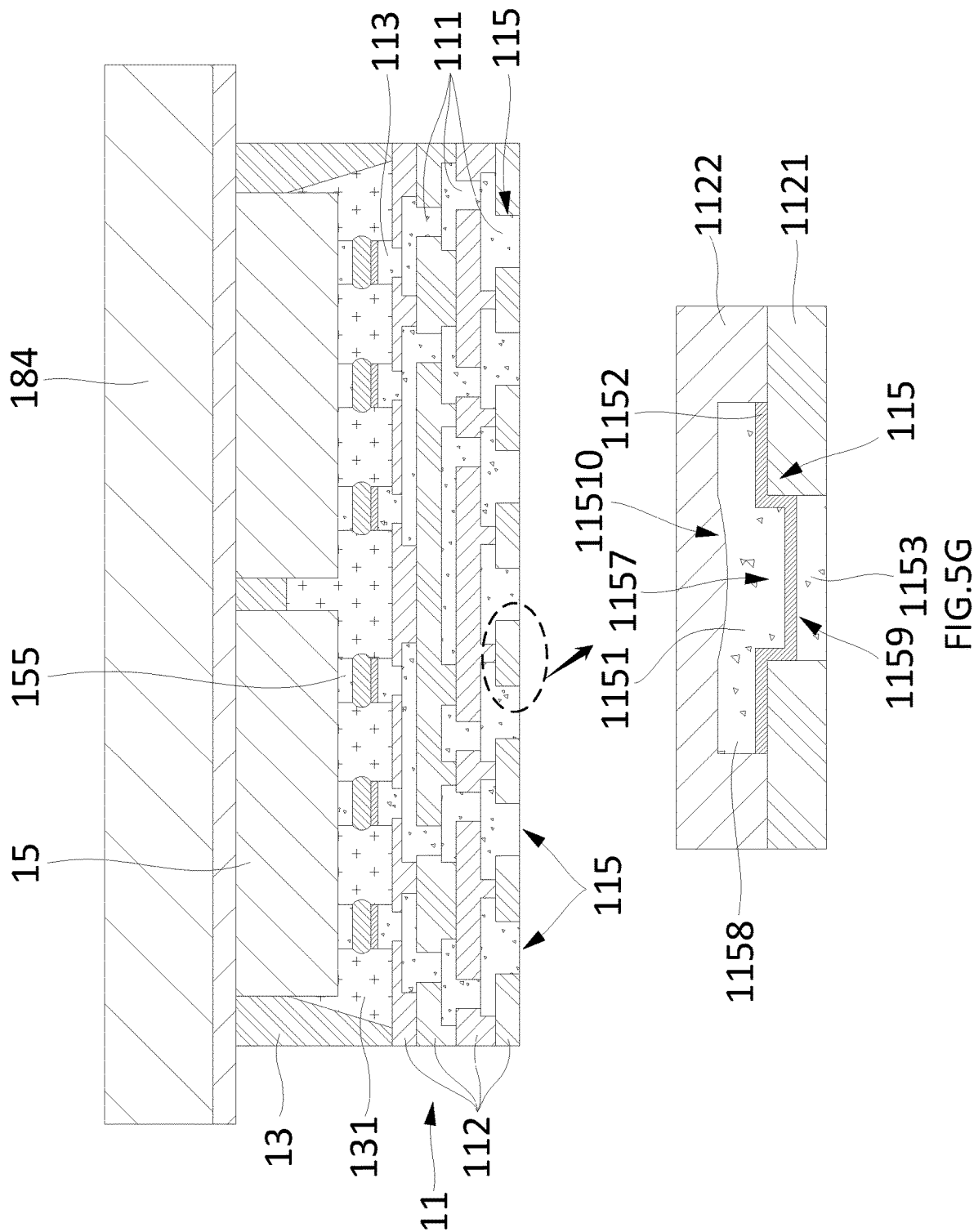

SEMICONDUCTOR DEVICES AND METHODS OF MANUFACTURING SEMICONDUCTOR DEVICES

CROSS-REFERENCE TO RELATED APPLICATION

This application is a divisional application of co-pending U.S. patent application Ser. No. 17/015,147 filed on Sep. 9, 2020, which is incorporated by reference herein and priority thereto is hereby claimed.

TECHNICAL FIELD

The present disclosure relates, in general, to electronic devices, and more particularly, to semiconductor devices and method of manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A, 4B, 4C, 4D, 4E, 4F, 4G, 4H, 4I, 4J, 4K, 4L, 4M, and 4N show a cross-sectional view of an example method for manufacturing an example electronic device.

FIGS. 5A, 5B, 5C, 5D, 5E, 5F, 5G, and 5H show a cross-sectional view of an example method for manufacturing an example electronic device.

Figure 1:
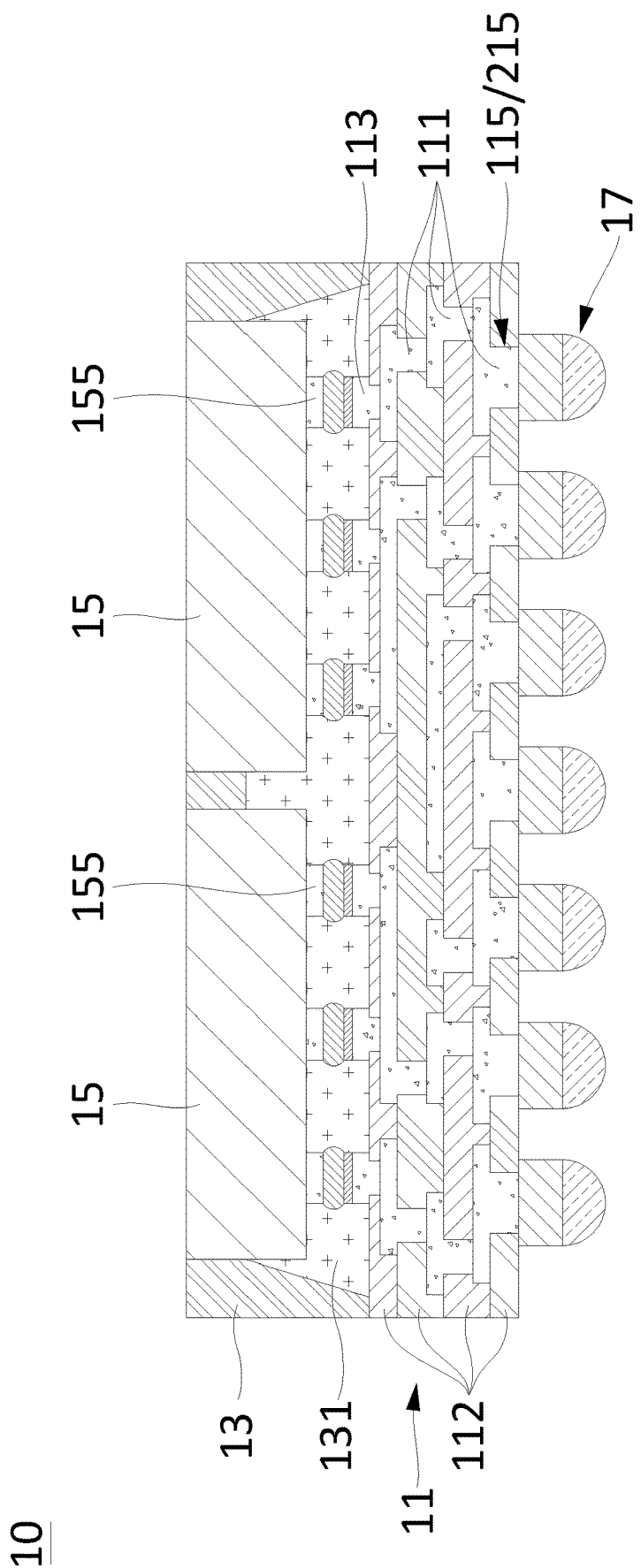
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

The present description includes, among other features, electronic devices and associated methods that include a substrate having a substrate outward terminal configured to reduce stress-related issues, such as cracks. In some examples, the substrate outward terminal comprises a multi-via terminal with conductive pad vias separated by a pad dielectric via. In some examples, the substrate outward terminal comprises a multi-stage terminal including a pad base and a pad head. Both substrate outward terminal structures reduce the size of dimples formed in the substrate outward terminal thereby reducing stress.

More particularly, in an example, a semiconductor device comprises a substrate comprising a first side, a second side opposite to the first side, a conductive structure comprising a substrate inward terminal at the first side and a substrate outward terminal at the second side, and a dielectric structure comprising a first dielectric having a first opening at the second side. A semiconductor component is at the first side of the substrate and is electrically coupled to the substrate inward terminal, and an encapsulant encapsulates the semiconductor component. The substrate outward terminal comprises one of a multi-via terminal or a multi-stage via. The multi-via terminal comprises pad conductive vias in the first opening a pad dielectric via interposed between the pad conductive vias in the first opening and a conductor comprising a conductor top side over the pad conductive vias and the pad dielectric via. The multi-stage terminal comprises a pad base within the first opening having a pad base top side recessed below an upper surface the first dielectric and a pad head coupled to the pad base within the first opening, the pad head having a pad head top side.

In an example, a semiconductor device comprises a substrate comprising a first side, a second side opposite to the first side, a conductive structure comprising a substrate inward terminal at the first side and a substrate outward terminal at the second side, and a dielectric structure comprising a first dielectric having a first opening at the second side. A semiconductor component is at the first side of the substrate and is electrically coupled to the substrate inward terminal, and an encapsulant encapsulates at least part of the semiconductor component. The substrate outward terminal comprises one of a multi-via terminal or a multi-stage terminal. The multi-via terminal comprises pad conductive vias within the first opening, a pad dielectric via interposed between the pad conductive vias in the first opening, and a conductor over the pad conductive vias and having a conductor top side, the conductor top side comprising micro dimples above the pad conductive vias. The multi-stage terminal comprises a pad base within the first opening having a pad base top side recessed below an upper surface the first dielectric, a pad head coupled to the pad base within the first opening, the pad head having a pad head top side, the pad top side comprising a single micro dimple above the pad base.

In an example, a method of manufacturing a semiconductor device comprises providing a substrate comprising a first side, a second side opposite to the first side, a conductive structure comprising a substrate inward terminal at the first side and a substrate outward terminal at the second side, and a dielectric structure comprising a first dielectric having a first opening at the second side. The method includes providing a semiconductor component at the first side of the substrate and electrically coupled to the substrate inward terminal. The method includes providing an encapsulant encapsulating at least part of the semiconductor component. The substrate outward terminal has a first width within the first dielectric, and the substrate outward terminal comprises a conductor over the first opening, the conductor comprising a conductor top side having at least one micro dimple with a maximum micro dimple depth of less than about twenty percent (20%) of the first width.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise substrate 11, encapsulant 13, electronic components 15, and external interconnects 17. Electronic device 10 can further comprise underfill 131 (optional).

Substrate 11 can comprise conductive structure 111, dielectric structure 112, substrate inward terminals 113, and substrate outward terminals 115/215. Electronic components 15 can further comprise component terminals 155.

Substrate 11, encapsulant 13 and external interconnects 17 can be referred to as a semiconductor package, and package can provide protection for electronic components 15 from external elements or environmental exposure. Semiconductor package can provide electrical coupling between external electrical components (not shown) and external interconnects 17.

Figure 2B:
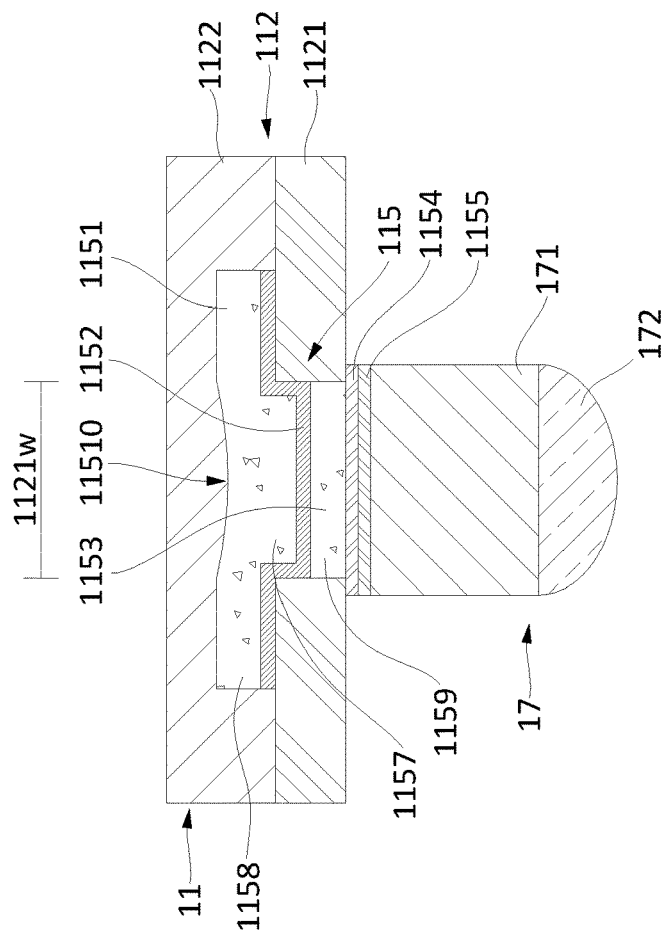
FIGS. 2A and 2B show partial cross-sectional views of an example electronic device.
Figure 2A:
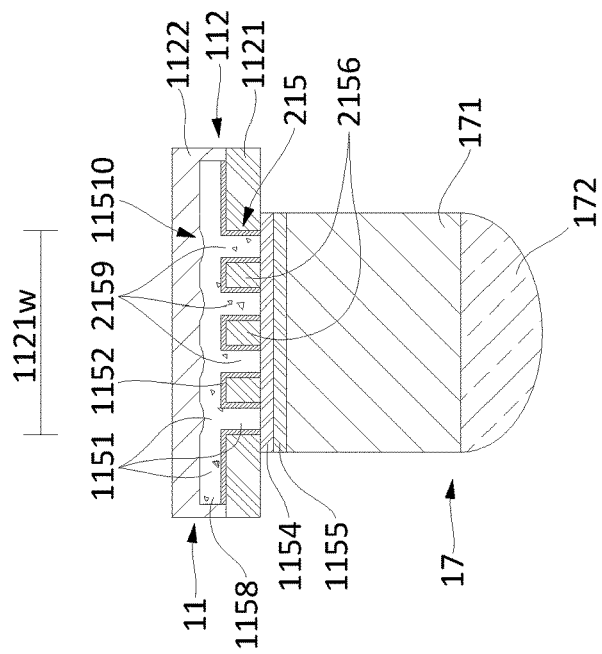

FIGS. 2A and 2B show partial cross-sectional views of an example electronic device 10. In the example shown in FIGS. 2A and 2B, substrate 11 can comprise dielectric structure 112, which can comprise dielectric 1121 and dielectric 1122, and conductive structure 111, which can comprise conductor 1151. In some examples, dielectric 1121 can be referred to a first dielectric and dielectric 1122 can be referred to a second dielectric. As illustrated in FIGS. 2A and 2B, dielectric 1121 includes an opening, such as a first opening, where substrate outward terminals 215 and 115 are formed.

In the example shown in FIG. 2A, substrate 11 can comprise one or more substrate outward terminals 215. In some examples, substrate outward terminals 215 can be referred to as multi-via terminals, such as multi-via pads or lands. In some examples, substrate outward terminals 215 can comprise conductor 1151, seed 1152, seed 1154, pad contacts 1155 (optional), traces 1158 (optional), pad conductive vias 2159, and pad dielectric vias 2156. Substrate outward terminals 215 have a terminal width 1121w within dielectric 1121.

In some examples, conductor 1151 can further comprise a plurality of micro dimples 11510. In some examples, micro dimples 11510 can correspond to locations of pad conductive vias 2159. In some examples, pad conductive vias 2159 and pad dielectric vias 2156 can be referred to as substrate outward terminals or multi-via terminals 215.

The multi-via configuration of substrate outward terminals 215 can serve to prevent formation of a larger or deeper valley or dimple in conductor 1151 across the top of substrate outward terminal 215. Instead, several smaller, shallower micro dimples 11510 may be formed. Because the shallower depths of micro dimple 11510 are minimized, conductive structure 111 including conductor 1151 and traces 1158 can have a more substantially uniform thickness that can prevent conductive structure 111 from cracking at the perimeter of substrate outward terminals 215 or at the transition between trace 1158 and pad conductive via 2159.

External interconnects 17 can be coupled to substrate outward terminals 215. In some examples, external interconnects 17 can comprise bumps 171 or solder 172 (optional). In some examples, bumps 171 can comprise a solder material or a copper material. In some examples, external interconnects 17 can comprise a solder ball. In some examples, external interconnects 17 can comprise a conductive pillar or post.

In the example shown in FIG. 2B, substrate 11 can comprise substrate outward terminals 115. In some examples, substrate outward terminals 115 can be referred to as two-stage terminals. In some examples, substrate outward terminals 115 can comprise conductor 1151, seed 1152, conductor 1153, seed 1154, pad contact 1155 (optional), pad head 1157, trace 1158 (optional), and pad base 1159. Substrate outward terminals 115 have terminal width 1121w within dielectric 1121.

In some examples, conductor 1151 can further comprise micro dimple 11510. In some examples, micro dimple 11510 can correspond to location of pad head 1157 and pad base 1159. In some examples, pad head 1157 and pad base 1159 can be referred to as substrate outward terminals or two-stage terminals 115. In some examples, pad base 1159 and pad head 1157 can respectively comprise first and second stages of two-stage terminals 115.

The two-stage configuration of substrate outward terminals 215 can serve to prevent formation of a larger or deeper valley or dimple in conductor 1151 across the top of substrate outward terminal 115. Instead, shallower micro dimple 11510 may be formed. Because the shallower depth of micro dimple 11510 is minimized, conductive structure 111 including conductor 1151 and traces 1158 can have a more substantially uniform thickness that can prevent conductive structure 111 from cracking at the perimeter of substrate outward terminals 115 or at the transition between trace 1158 and pad head 1157.

Figure 3B:
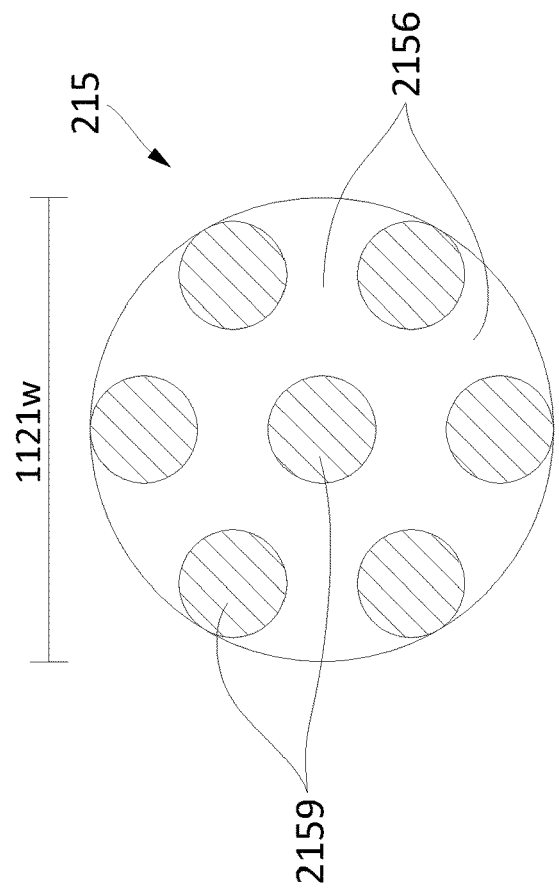
FIGS. 3A and 3B show plan views of an example electronic device.
Figure 3A:
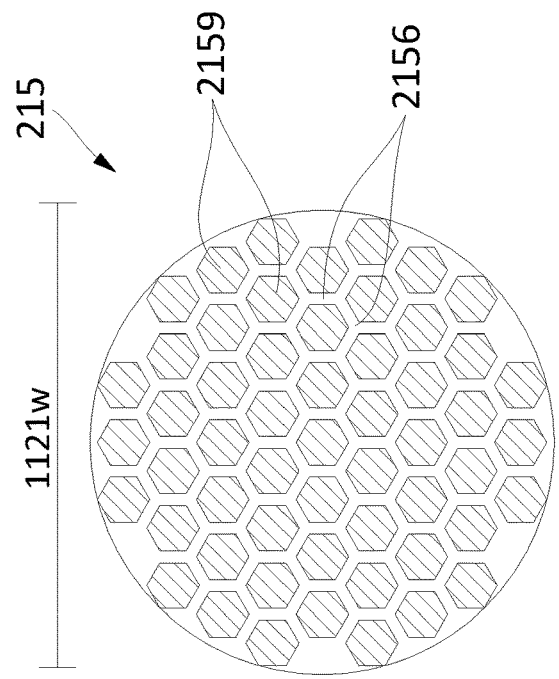

FIGS. 3A and 3B show plan views of example multi-via terminals 215. In the example shown in FIG. 3A, substrate outward terminals or multi-via terminals 215 can comprise pad conductive vias 2159 and pad dielectric vias 2156. In some examples, pad conductive vias 2159 or pad dielectric vias 2156 can have circular, triangular, quadrangular, pentagonal, hexagonal, or polygonal shapes when planarly viewed. In some examples, a width of pad conductive vias 2159, or of pad dielectric vias 2156, can range from about 1 micrometer (µm) to about 20 µm. In some examples, a pitch of pad conductive vias 2159, or of pad dielectric vias 2156, can range from about 1 µm to about 20 µm. In some examples, terminal width 1121w of multi-via terminals 215 can range from about 10 µm to about 200 µm.

Figure 4A:
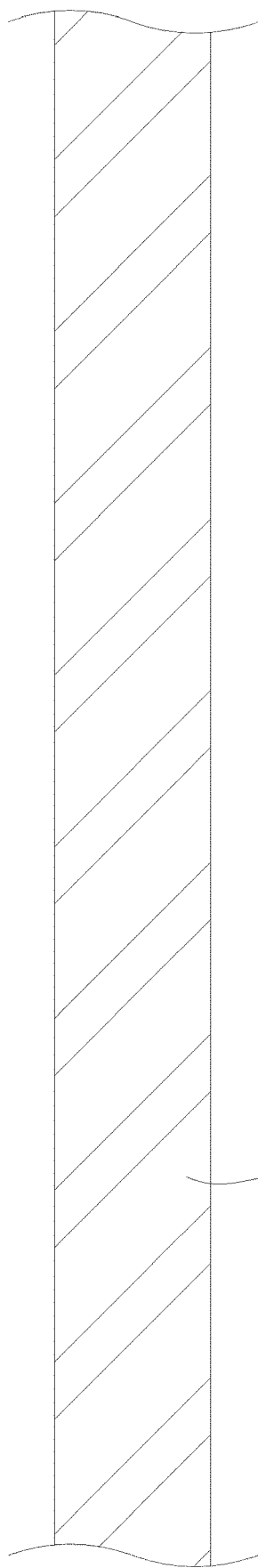
Figure 4B:
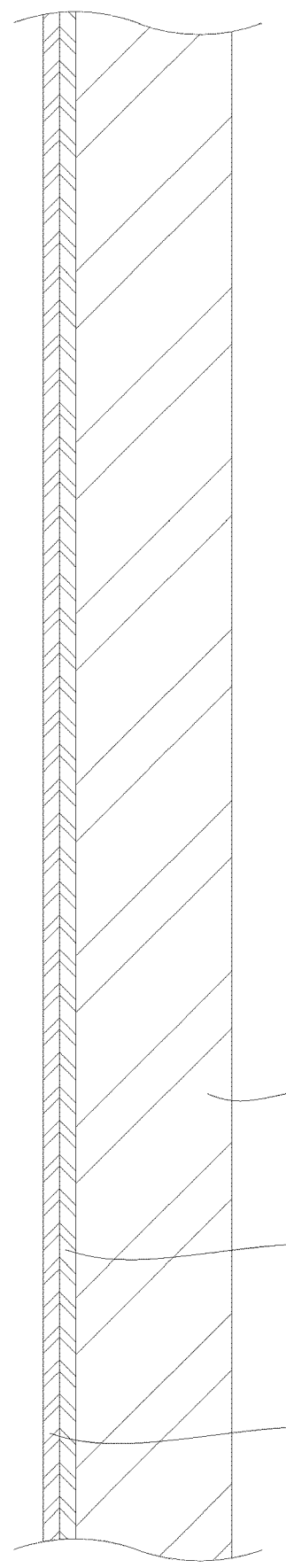
Figure 4G:
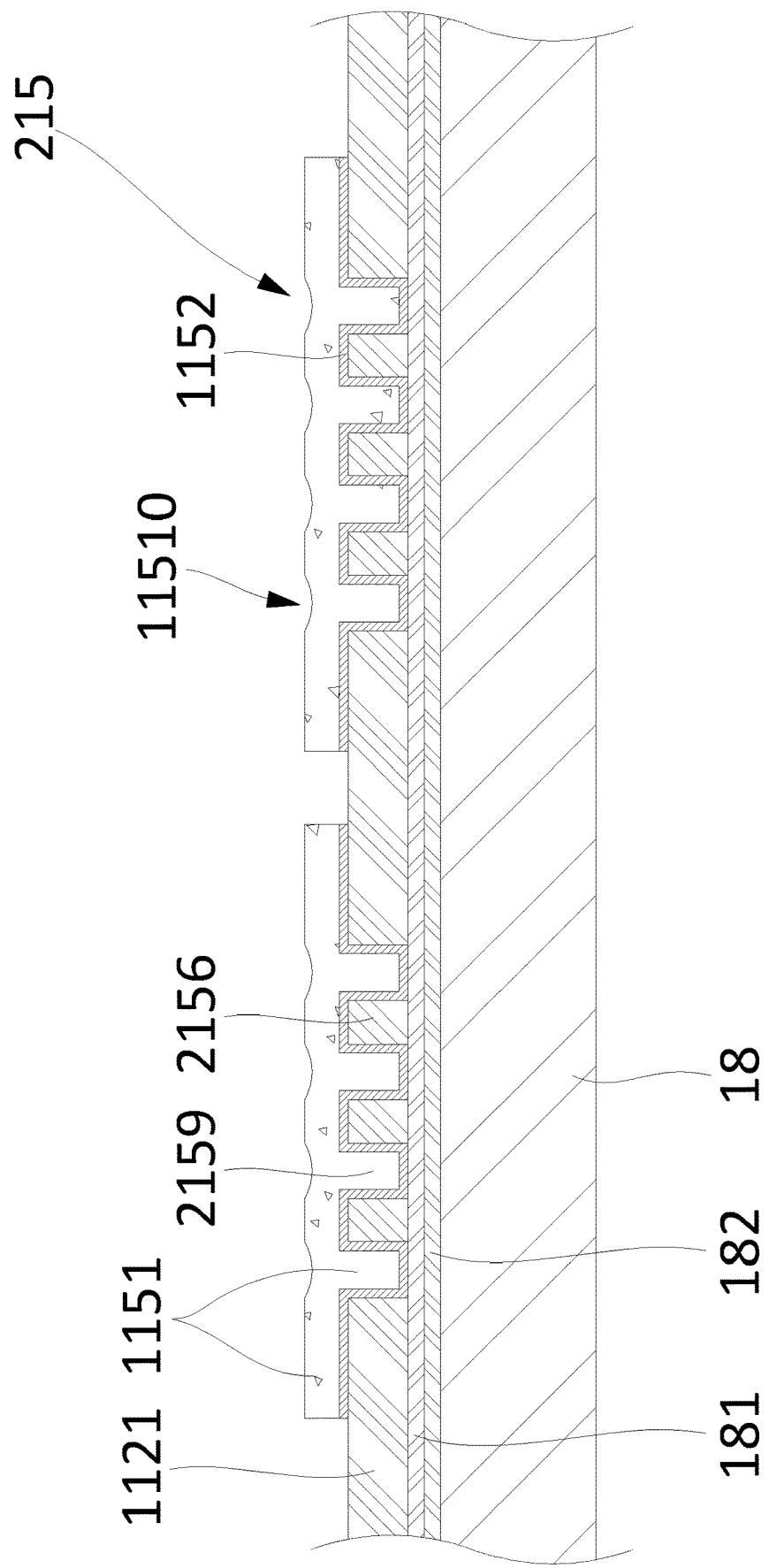
Figure 4H:
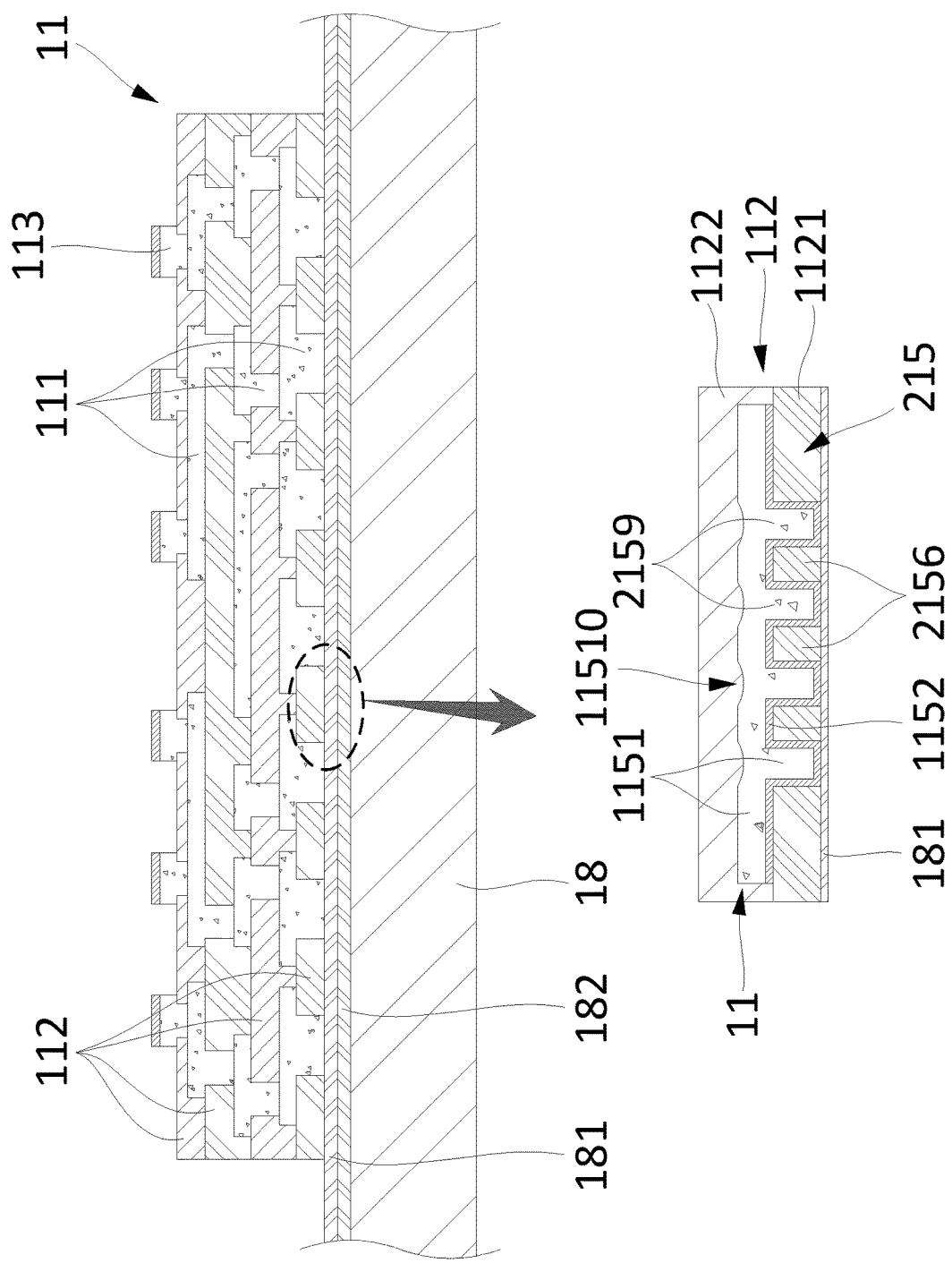
Figure 4I:
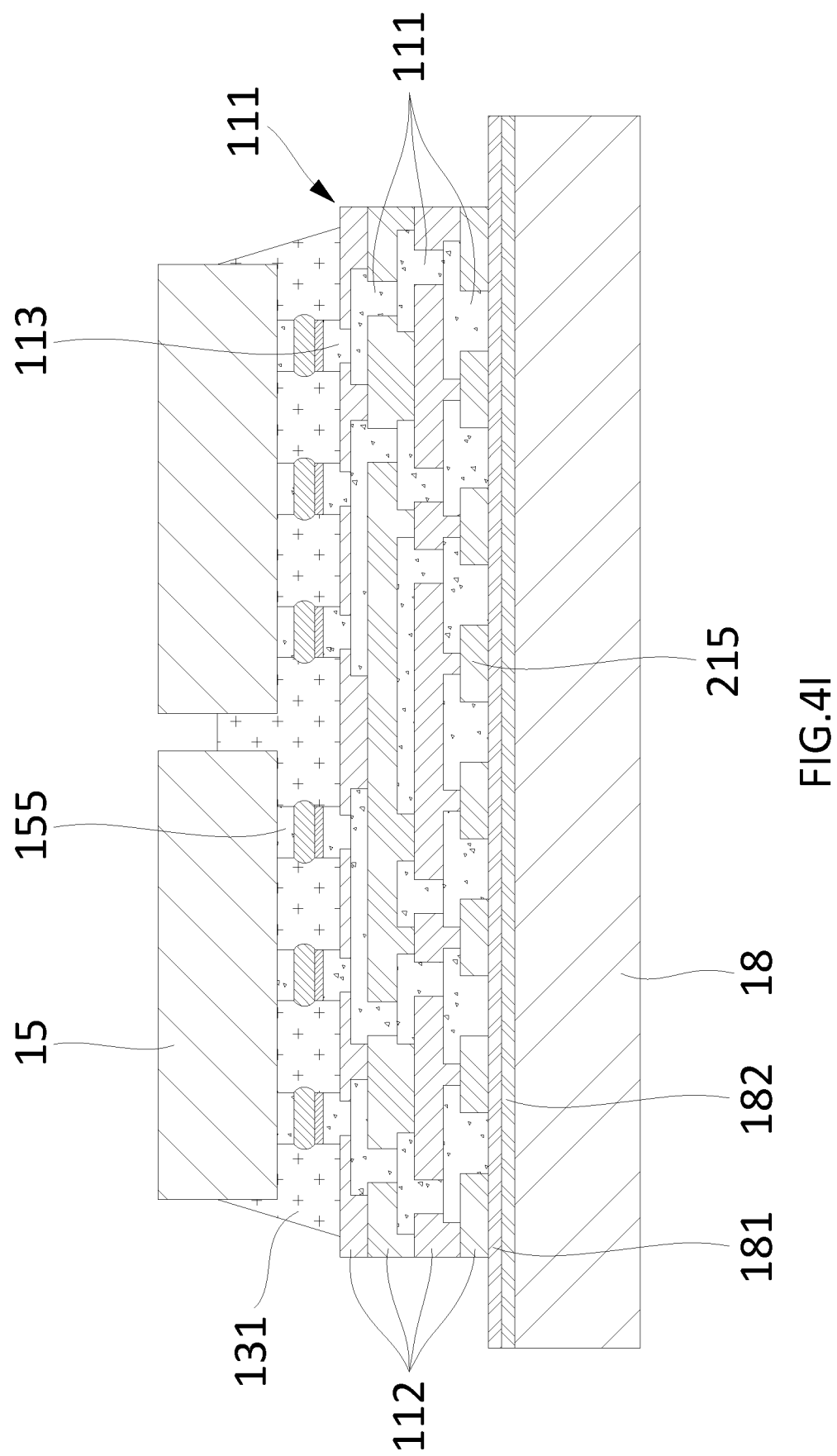
Figure 4J:
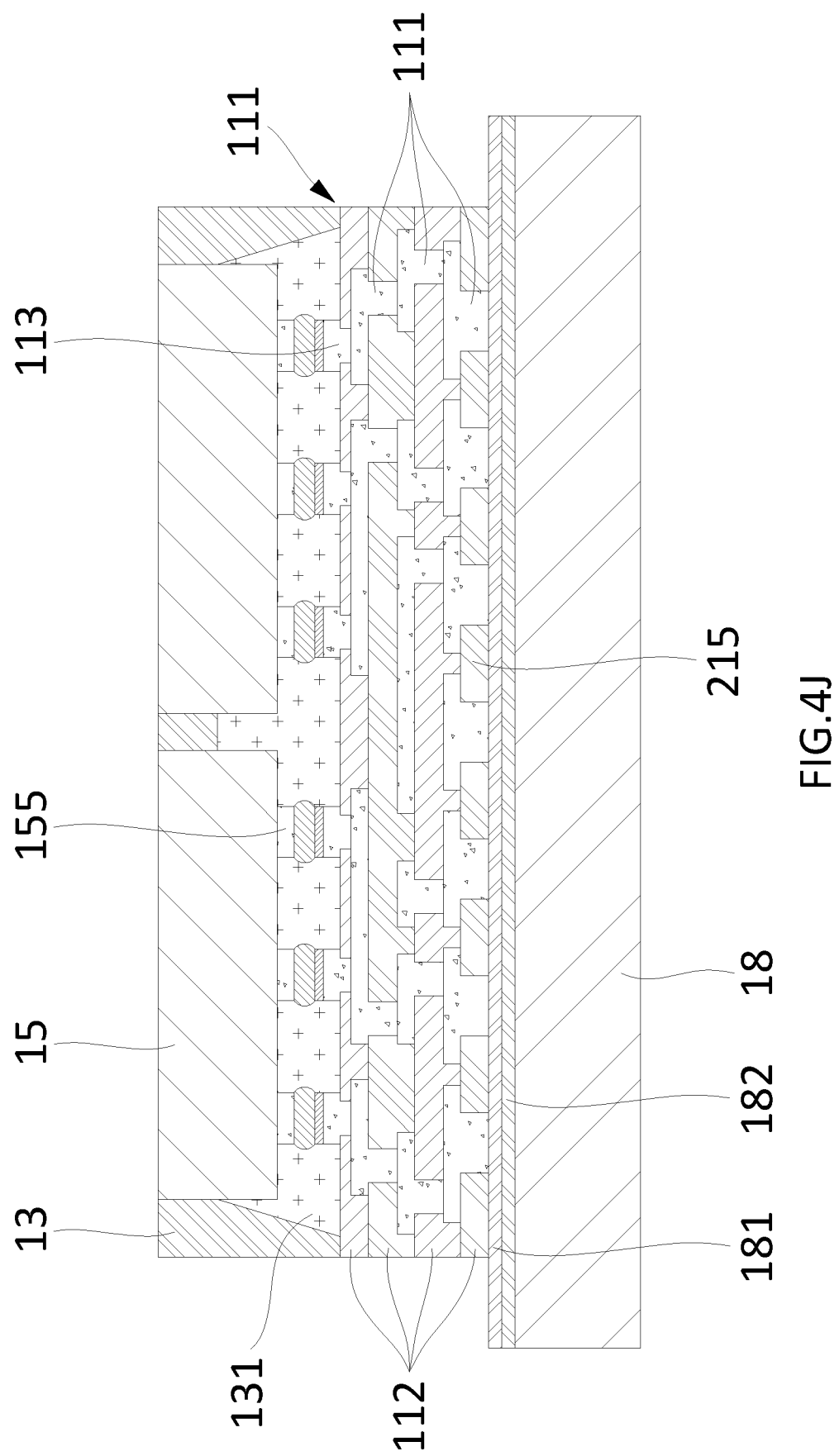
Figure 4K:
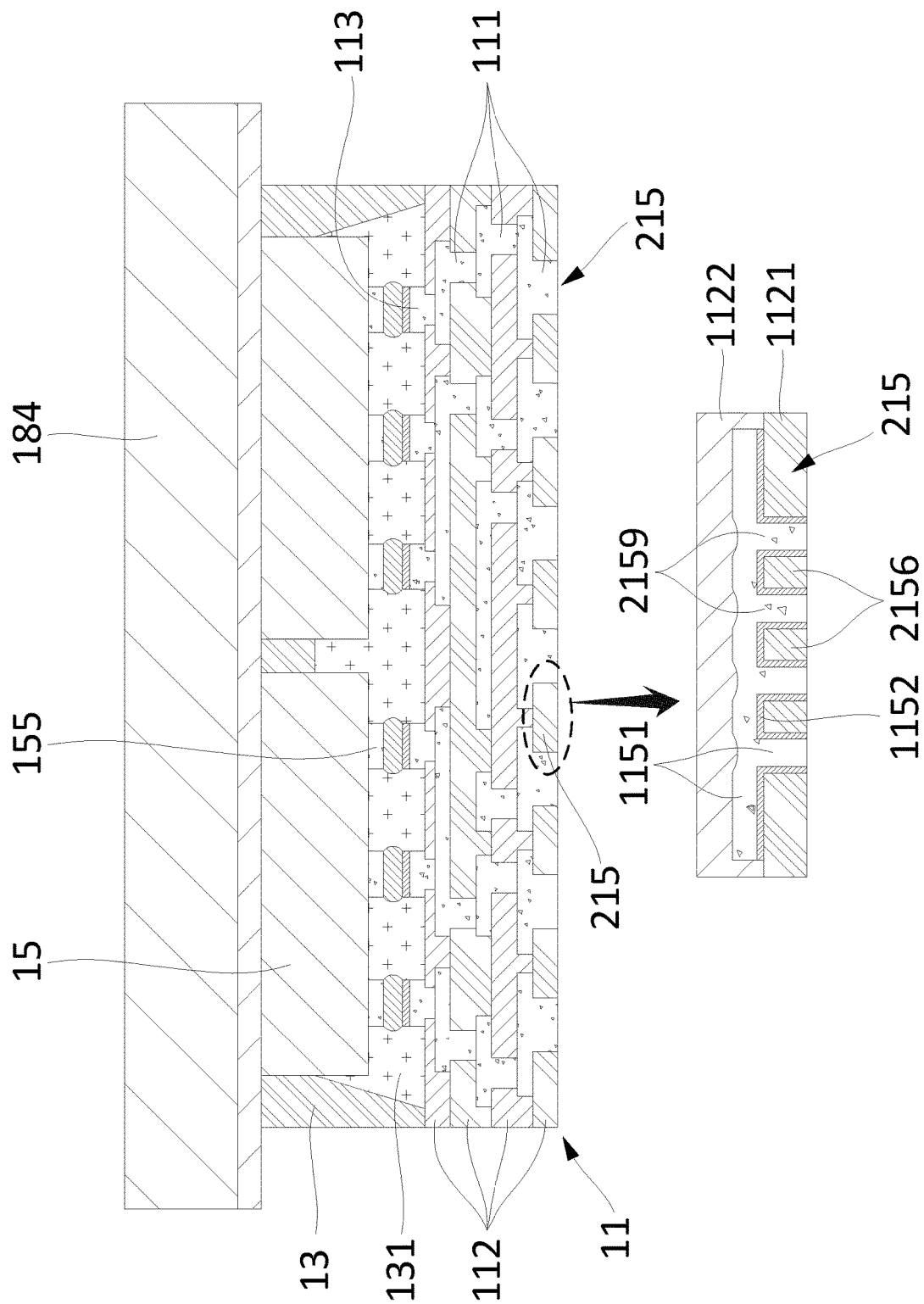
Figure 4L:
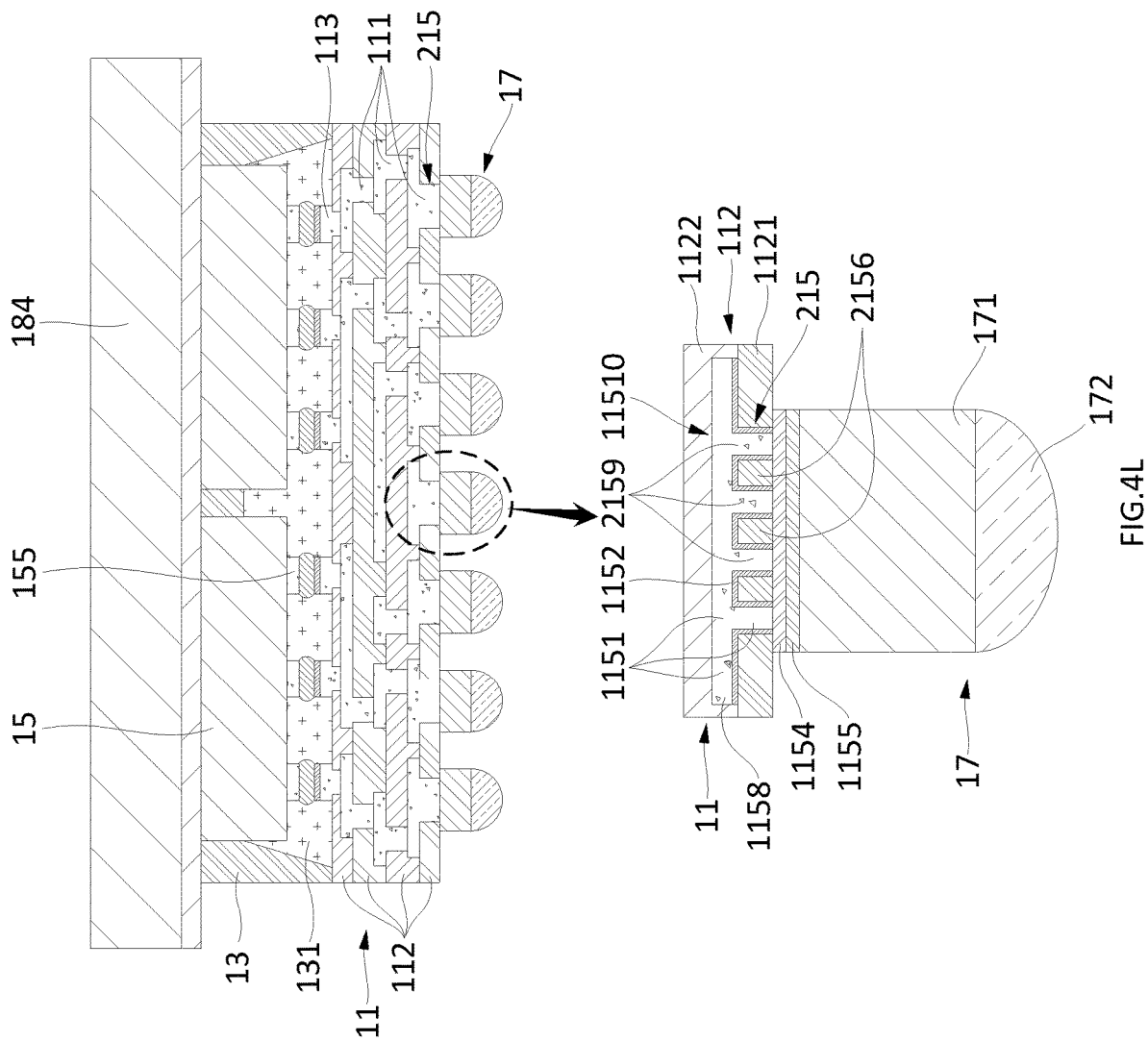
Figure 4M:
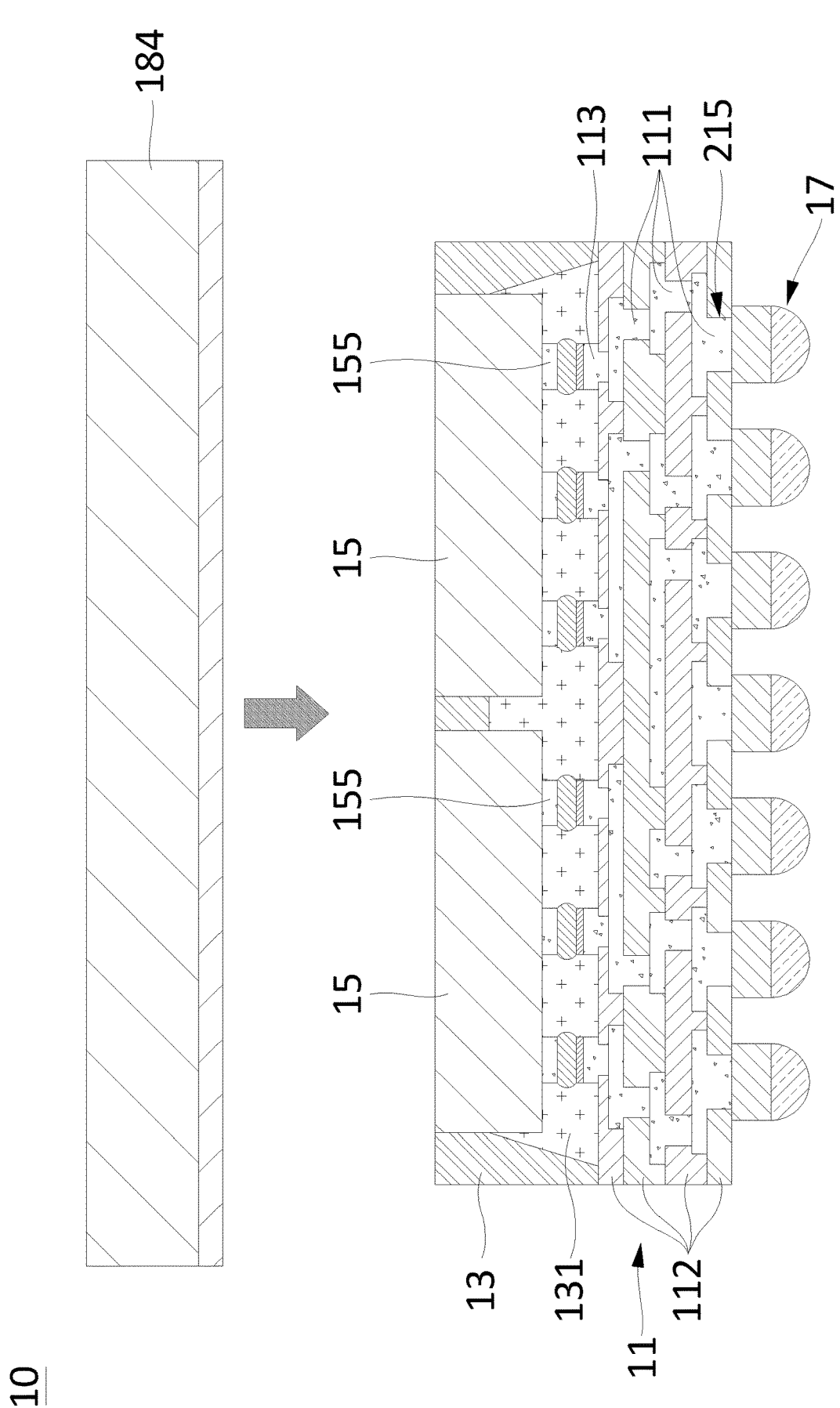
Figure 4N:
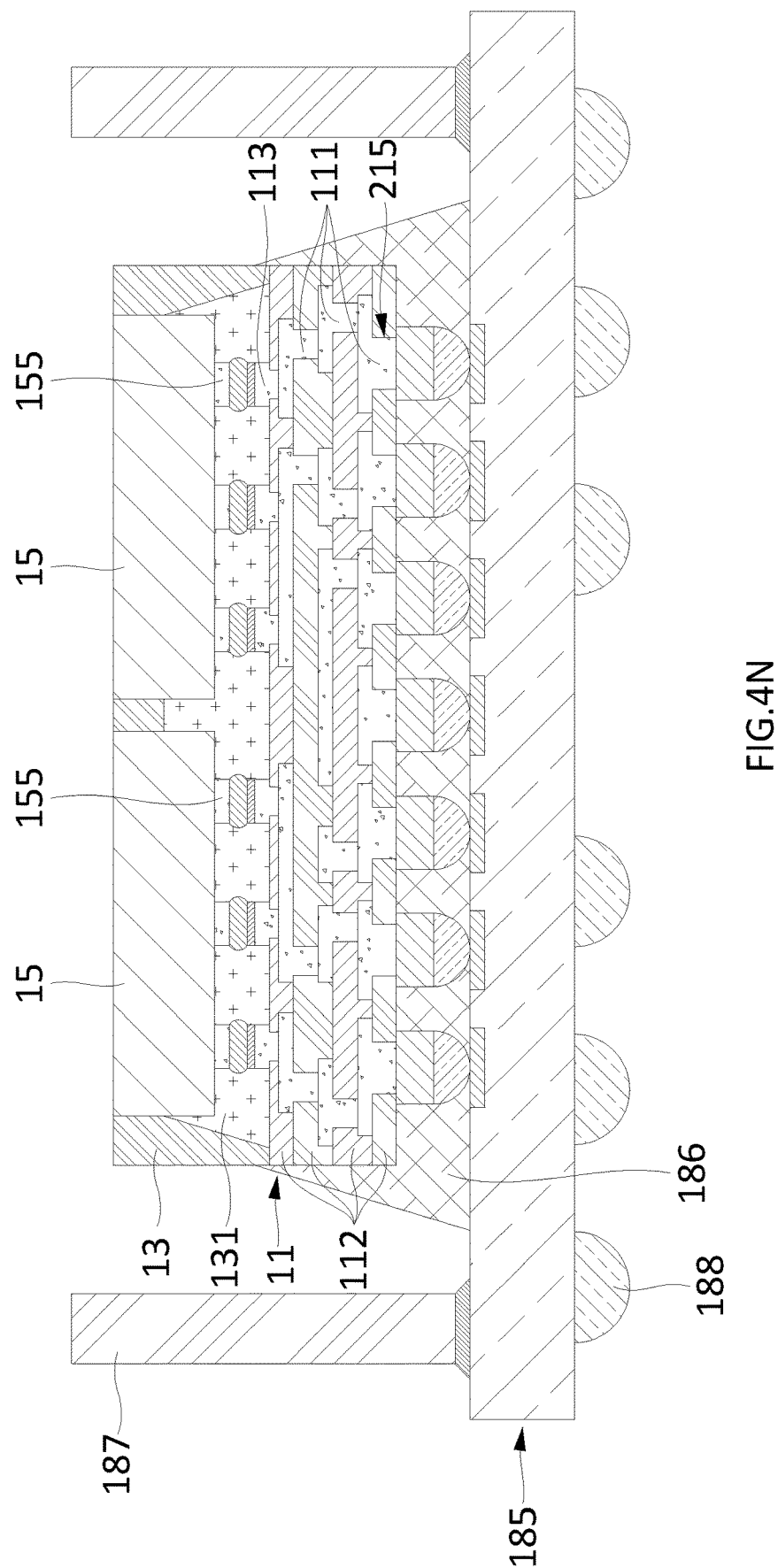

FIGS. 4A to 4N show cross-sectional views of an example method for manufacturing electronic device 10 having multi-via terminals 215. FIG. 4A shows a cross-sectional view of electronic device 10 at an early stage of manufacture.

In the example shown in FIG. 4A, carrier 18 can be provided. In some examples, carrier 18 can comprise or be referred to as a silicon, glass wafer, or ceramic wafer or panel. In some examples, carrier 18 can be circular plate quadrangular (e.g., rectangular or square). Carrier 18 can support substrate 11, electronic components 15, and encapsulant 13 in stages described below.

FIG. 4B shows a cross-sectional view of electronic device 10 at a later stage of manufacture. In the example shown in FIG. 4B, seed layer 181 can be formed on a top side of carrier 18. In some examples, seed layer 181 can comprise or be referred to as a barrier. In some examples, seed layer 181 can be formed using an electroless plating process, an electroplating process, a spraying process, or a sputtering process. In some examples, seed layer 181 can comprise titanium (Ti), titanium tungsten (TiW), titanium/copper (Ti/Cu), titanium tungsten/copper (TiW/Cu) or nickel vanadium (NiV). In some examples, the thickness of seed layer 181 can range from about 0.01 µm to about 5 µm. Direct current can be supplied to conductive structure 111 through seed layer 181 in a subsequent process of forming conductive structure 111.

In some examples, temporary adhesive film 182 can be located on top side of carrier 18, and seed layer 181 can be formed on temporary adhesive film 182. In some examples, temporary adhesive film 182 can comprise or be referred to as a double-sided adhesive tape. Substrate 11 can be easily separated from carrier 18 by temporary adhesive film 182 in a subsequent process.

FIG. 4C shows a cross-sectional view of electronic device 10 at a later stage of manufacture. In the example shown in FIG. 4C, dielectric 1121 can be formed on seed layer 181, and a plurality of patterns 1121a can be formed on dielectric 1121. In some examples, patterns 1121a can comprise or be referred to as openings including first openings.

In some examples, regions of seed layer 181 can be exposed through openings 1121a of dielectric 1121. When planarly viewed, openings 1121a can have circular, triangular, quadrangular, pentagonal, hexagonal or polygonal shapes (see e.g. FIGS. 3A and 3B).

In some examples, dielectric 1121 can comprise or be referred to as polyimide. In some examples, dielectric 1121 can be directly attached onto seed layer 181 in a dry film phase to then be patterned, or can be coated on seed layer 181 in a liquid phase using spin coating, spray coating, dip coating or rod coating to then be cured and patterned.

In some examples, the patterning can be performed after coating photoresist on dielectric 1121 and curing. In some examples, photoresist can be coated on dielectric 1121 using spin coating, spray coating, dip coating or rod coating, to then be cured.

In some examples, a mask having patterns can be positioned on photoresist and UV (ultraviolet) rays can be irradiated into the mask, thereby transferring patterns on the photoresist. In some examples, a transferred portion or a non-transferred portion of the photoresist can be developed, and thus patterns (e.g., openings) can be formed in the photoresist. Photoresist having patterns can be used as the mask. In some examples, some regions of dielectric 1121 exposed through the openings of the photoresist can be etched using an etching solution, thereby patterning dielectric 1121. Accordingly, a plurality of openings 1121a can be formed in dielectric 1121, thereby exposing some regions of seed layer 181 through openings 1121a. After patterning dielectric 1121, in some examples, the photoresist on dielectric 1121 can be removed by, for example, acetone.

In some examples, when a photo-sensitive polyimide (PSPI) film is used as dielectric 1121, a photo/etch process can be directly performed on the PSPI film without the photoresist, thereby patterning dielectric 1121.

In some examples, the thickness of dielectric 1121 can range from about 1 µm to about 20 µm, the width or pitch of openings 1121a formed on dielectric 1121 can range from about 1 µm to about 20 µm, and the overall width of a group 1121b of the plurality of openings 1121a can range from about 20 µm to about 200 µm.

In some examples, dielectric 1121 can provide a basic structure for forming seed layer 1152, conductive structure 111, or dielectric structure 112 in a subsequent process. Although two groups 1121b each including four openings 1121a are shown in FIG. 4C, such openings 1121a or groups 1121b can be more or fewer than those shown in FIG. 4C. In some examples, the openings 1121a of one group 1121b may constitute one substrate outward terminal or one multi-via terminal 215, and substrate 11 can comprise a plurality of substrate outward terminals or a plurality of multi-via terminals 215.

FIG. 4D shows a cross-sectional view of electronic device 10 at a later stage of manufacture. In the example shown in FIG. 4D, seed layer 1152 for conductive structure 111 can be formed on dielectric 1121 and seed layer 181. Since a plurality of openings 1121a in group 1121b are formed in dielectric 1121, seed layer 1152 can be formed along the sides or side wall surfaces of openings 1121a and group 1121b. Generally, seed layer 1152 can be formed in a substantially uneven pattern due to the plurality of openings 1121a formed in dielectric 1121 when cross sectionally viewed. The forming process, the material and the thickness of seed layer 1152 can be similar to those of seed layer 181. Direct current can be supplied to conductive structure 111 through seed layer 1152 in a subsequent process of forming conductive structure 111.

FIG. 4E shows a cross-sectional view of electronic device 10 at a later stage of manufacture. In the example shown in FIG. 4E, photoresist 183 can be coated on seed layer 1152, and photoresist 183 can then be patterned. In some examples, photoresist 183 can comprise one opening 183a per group 1121b. Accordingly, a plurality of uneven seed layers 1152 can be exposed through openings 183a. The coating, curing and patterning methods of photoresist 183 can be similar to those of the photoresist previously described.

FIG. 4F shows a cross-sectional view of electronic device 10 at a later stage of manufacture. In the example shown in FIG. 4F, conductor 1151 can be formed on seed layer 1152. Conductor 1151 can comprise or be referred to as a conductive layer. In some examples, a metal such as copper can be electroplated, and thus conductor 1151 can be formed across uneven seed layer 1152. In some examples, the line/space/thickness of conductor 1151 can range from about 0.5/0.5/0.5 µm to about 10/10/10 µm. In some examples, conductor 1151 in openings 1121a of dielectric 1121 can be referred to as pad conductive vias 2159, and dielectric 1121 existing between pad conductive vias 2159 can be referred to as pad dielectric vias 2156. Similarly, as described above, the line/space/thickness of pad conductive vias 2159 or pad dielectric vias 2156 can range from about 1 µm to about 20 µm. As described above, pad conductive vias 2159 and pad dielectric vias 2156 can be collectively referred to as substrate outward terminals or multi-via terminals 215.

In some examples, micro dimples 11510 can be formed on an upper side of conductor 1151 corresponding to locations of pad conductive vias 2159 (see FIG. 2A). Since pad conductive vias 2159 have a relatively small width, micro dimples 11510 can have a relatively small depth.

In some examples, multi-via terminals 215 can permit the depth of micro dimple 11510 to be about 1/100 to about 1/10 of the depth of the conventional dimple that would otherwise be formed over a conventional pad or terminal. In some examples, the depth of micro dimple 11510 can range from about 0.1 µm to about 2 µm. In some examples, the depth of micro dimple 11510 can be less than about 1 µm. In some examples, the depth of micro dimple 11510 can be less than about 0.5 µm. In some examples, the depth of micro dimple 11510 can be less than about twenty percent (20%) of terminal width 1121w of substrate outward terminal 115 (see FIG. 2B). For instance, if terminal width 1121w is 10 µm, the depth of each of micro dimple 11510 can be less than about 2 µm.

In some examples, multi-via terminals 215 can permit reduction of the thickness of conductor 1151, where the shallower depth of micro dimple 11510 can reduce the need for a thicker conductor 1151 to compensate for the deeper depth of the dimple that would otherwise be formed in a conventional pad. Therefore, cracking of conductive structure 111 around pad edges can be suppressed, or the thickness of conductive structure 111 can be reduced due to the suppressed likelihood of cracking.

In the example shown in FIG. 4F, two multi-via terminals or two substrate outward terminals 215 are shown, which is, however, simplified for a better understanding of the present disclosure. In practice, several tens to several thousands of multi-via terminals or substrate outward terminals 215 can be concurrently formed.

FIG. 4G shows a cross-sectional view of electronic device 10 at a later stage of manufacture. In the example shown in FIG. 4G, photoresist 183 and seed layer 1152 can be removed. In some examples, photoresist 183 present at exterior sides of substrate outward terminals 215 can be stripped by, for example, acetone. In some examples, seed layer 1152 present outside the footprint of substrate outward terminals 215 can be etched. After removing photoresist 183 and seed layer 1152, dielectric 1121 outside the footprint of substrate outward terminals 215 can be exposed.

FIG. 4H shows a cross-sectional view of electronic device 10 at a later stage of manufacture. In the example shown in FIG. 4H, the above-described processes (the process of forming dielectrics 1121 and 1122 and the process of forming conductor 1151) can be repeatedly performed, thereby completing substrate 11 including dielectric structure 112 and conductive structure 111.

In some examples, dielectric structure 112 can comprise or be referred to as one or more dielectric layers, solder mask layers, core layers, prepreg layers, or polyimide layers. In some examples, each of dielectric 1121 and dielectric 1122 can comprise or be referred to as a dielectric layer. In some examples, conductive structure 111 can comprise or be referred to as one or more conductive layers, traces, vias, pads, or under bump metallization (UBM) vias. In some examples, conductor 1151 can comprise or be referred to as a conductive layer.

In some examples, topmost conductive structure 111 can protrude from the top side of topmost dielectric structure 112 and can comprise or be referred to as substrate inward terminals 113. In some examples, substrate inward terminals 113 can comprise or be referred to as pads, lands, under bump metallizations (UBMs), or stud bumps. The line/space/thickness of substrate inward terminals 113 can range from about 0.5/0.5/0.5 µm to about 10/10/10 µm. In some examples, as described above, substrate outward terminals 215 can comprise or be referred to as multi-via terminals or can comprise or be referred to as pads or lands.

For a better understanding of the present disclosure, FIG. 4H illustrates that substrate 11 including six (6) substrate inward terminals 113 and seven (7) substrate outward terminals 215, and each of substrate outward terminals 215 can comprise pad conductive vias 2159 and pad dielectric vias 2156.

FIG. 4H illustrates one substrate 11, in some examples, a plurality of substrates 11 can be arrayed on carrier 18 in a matrix or strip type. In some examples, plurality of substrates 11 can be separated from one another or can be connected to one another.

In some examples, pad conductive vias 2159 can still contact seed layer 181 through seed layer 1152 and can still contact pad dielectric vias 2156 through seed layer 1152. In some examples, conductor 1151 can contact a top side of dielectric 1121 through seed layer 1152.

In some examples, substrate 11 can be referred as a redistribution layer ("RDL") substrate. RDL substrates can comprise one or more conductive redistribution layers and one or more dielectric layers that can be formed layer by layer over the carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer.

Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

FIG. 4I shows a cross-sectional view of electronic device 10 at a later stage of manufacture. In the example shown in FIG. 4I, electronic components 15 can be coupled to substrate 11. In some examples, electronic components 15 can comprise or be referred to as chips, dies, or packages. In some examples, electronic components 15 can comprise digital signal processors (DSPs), network processors, power management processors, audio processors, Radio-Frequency or wireless components, antennas, wireless baseband system-on-chip (SoC) processors, sensors, or application specific integrated circuits. In some examples, the thickness of electronic components 15 can range from about 50 μm to about 900 μm.

In some examples, electronic components 15 can comprise or be referred to as component terminals 155, and component terminals 155 can be coupled to substrate inward terminals 113. Component terminals 155 can comprise or be referred to as pads, pillars, or bumps. In some examples, component terminals 155 can be connected to substrate inward terminals 113 using bonding material, such as solder. In some examples, electronic components 15 can be coupled to substrate inward terminals 113 using a mass reflow process, a thermal compression process or a laser assist bonding process. In addition, the sizes of component terminals 155 can range from about 5 μm to about 50 μm.

In some examples, underfill 131 can fill gaps between substrate 11 and electronic components 15. Underfill 131 can comprise or be referred to as capillary underfill, no-flow underfill, also called non-conductive paste (NCP), molded underfill (MUF) or non-conductive film (NCF). In some examples, after electronic components 15 are coupled to substrate 11, underfill 131 (e.g., capillary underfill) can be injected into gaps between electronic components 15 and substrate 11. In some examples, after being coated on substrate 11, electronic components 15 can press underfill 131 (e.g., no-flow underfill). In some examples, after being coated on component terminals 155 of electronic components 15, underfill 131 can be attached onto substrate 11 while being pressed by electronic components 15. In some examples, underfill 131 (e.g., molded underfill) can fill gaps between electronic components 15 and substrate 11 and can cover electronic components 15. In some examples, after underfill 131 (e.g., non-conductive film (NCF)) is positioned on substrate inward terminals 113 in a film type and then pressed by electronic components 15, a solder reflow process and an underfill curing process can be simultaneously performed. As described above, underfill 131, positioned between electronic components 15 and substrate 11, can cover component terminals 155, and electronic components 15 and substrate 11 can be mechanically coupled to each other. Underfill 131 can redistribute the stress and deformation due to a difference in the coefficient of thermal expansion (CTE) between electronic components 15 (e.g., 2-4 ppm/° C.) and substrate 11 (e.g., 20-30 ppm/° C.), can prevent moisture infiltration, can prevent physical or chemical shocks from being transferred to electronic components 15, and can rapidly transfer heat generated from electronic components 15 to the outside. Underfill 131 can be optional in some examples.

FIG. 4J shows a cross-sectional view of electronic device 10 at a later stage of manufacture. In the example shown in FIG. 4J, electronic components 15 and underfill 131 on substrate 11 can be encapsulated by encapsulant 13 having. In some examples, encapsulant 13 can comprise an epoxy resin, a phenol resin, carbon black, or a silica filler. In some examples, encapsulant 13 can comprise or be referred to as a mold compound, a resin, a sealant, a filler-reinforced polymer, or an organic body. In some examples, encapsulant 131 can exist on side and top sides of electronic components 15. In some examples, top sides of electronic components 15 can be coplanar with a top side of encapsulant 13. In some examples, the top sides of electronic components 15 can be exposed through the top side of encapsulant 13. In some examples, encapsulant 13 can be formed by compression molding, transfer molding, liquid-phase encapsulant molding, vacuum lamination, paste printing, or film assist molding. The compression molding can be a process of supplying a flowable resin to a mold in advance and then inserting a relevant electronic component into the mold to then cure the resin, and the transfer molding can be a process of supplying a flowable resin to a region ranging from a mold gate (a supply orifice) to the vicinity of a relevant electronic component and then curing the resin. The thickness of encapsulant 13 can range from about 100 μm to about 1000 μm. Encapsulant 13 can provide protection for electronic components 15 from external elements or environmental exposure. In some examples, underfill 131 can be omitted and encapsulant 13 can fill gaps between electronic components 15 and substrate 11. In some examples, when the sizes of silica fillers are smaller than the gaps between electronic components 15 and substrate 11, encapsulant 13 can act as underfill 131 for substrate 11.

FIG. 4K shows a cross-sectional view of electronic device 10 at a later stage of manufacture. In the example shown in FIG. 4K, carrier 18 can be removed from substrate 11. In some examples, wafer support system 184 can first be attached onto encapsulant 13 or electronic components 15. In some examples, when temporary adhesive film 182 is interposed between substrate 11 and carrier 18, heat or light (e.g., laser beam) is supplied to temporary adhesive film 182, and thus adhesiveness of temporary adhesive film 182 can be removed, thereby removing carrier 18 from substrate 11. In some examples, carrier 18 can also be forcibly peeled off or twisted from substrate 11 using a mechanical force. In some examples, carrier 18 can be removed by mechanically grinding and chemically etching.

In some examples, seed layer 181 can be etched or removed from substrate outward terminals 215 and dielectric 1121 provided on substrate 11. In some examples, seed layer 1152 positioned on bottom sides of pad conductive vias 2159 can also etched and removed. Accordingly, pad conductive vias 2159 positioned between pad dielectric vias 2156 can be exposed. In some examples, some regions of seed layer 1152 interposed between pad dielectric vias 2156 and pad conductive vias 2159 can also be exposed. In some examples, pad conductive vias 215 and some regions of seed layer 1152 can be exposed through pad dielectric vias 2156. In some examples, the bottom sides of pad conductive vias 2159 and pad dielectric vias 2156 can be coplanar with the bottom side of dielectric 1121 positioned around the pad conductive vias 2159 and pad dielectric vias 2156.

FIG. 4L shows a cross-sectional view of electronic device 10 at a later stage of manufacture. In the example shown in FIG. 4L, external interconnects 17 can be provided. In some examples, seed layer 1154 can first be formed on the bottom side of substrate 11. Seed layer 1154 can be coupled to pad conductive vias 2159 or seed layer 1152, and can contact pad dielectric vias 2156. The forming process or materials of seed layer 1154 can be similar to those of seed layer 181 or 1152.

Photoresist can be coated on seed layer 1154 and then patterned. By the patterning of the photoresist, openings can be formed at regions corresponding to substrate outward terminals, i.e., multi-via terminals 215, and some regions of seed layer 1154 (regions corresponding to substrate outward terminals, i.e., multi-via terminals 215) can be exposed through the openings.

External interconnects 17 can be provided on exposed seed layer 1154. External interconnects 17 can comprise or be referred to as pillars, posts, pads, lands, bumps, or solder balls. External interconnects 17 can be formed on seed layer 1154 on substrate outward terminals 215 using a plating process, or can be coupled to substrate outward terminals 215 using a mass reflow process or a laser assist bonding process after external interconnects 17 are positioned on substrate outward terminals 215. In some examples, external interconnects 17 can comprise bumps 171 and solder tips 172 (optional). The sizes of external interconnects 17 can range from about 20 µm to about 400 µm. External interconnects 17 can couple an electronic device to an external device. In some examples, bumps 171 can be better connected to the external device by solder tips 172.

In some examples, pad contacts 1155 can be formed on seed layer 1154, and external interconnects 17 can be attached onto pad contacts 1155. In some examples, pad contacts 1155 can comprise or be referred to as under bump metallizations (UBMs). In some examples, pad contacts 1155 can be formed on seed layer 1154 using an electroplating process. The thickness of pad contacts 1155 can range from about 0.01 µm to about 5 µm. Pad contacts 1155 can comprise copper, gold, silver, nickel, palladium or solder. Pad contacts 1155 facilitate formation or attachment of bumps 171.

In some examples, photoresist and seed layer 1154 present outside the footprint of external interconnects 17 can be removed. In some examples, photoresist can be removed by acetone, and seed layer 1154 can be etched by an etching solution.

FIG. 4M shows a cross-sectional view of electronic device 10 at a later stage of manufacture. In the example shown in FIG. 4M, encapsulant 13 or electronic components 15 can be removed from wafer support system 184. In such a manner, a discrete electronic device 10 can be completed. In some examples, when a plurality of electronic devices 10 are formed in an array of rows or columns, individual electronic devices 10 can be separated from each other using a sawing or singulation process. In some examples, encapsulant 13 and substrate 11 can be sawed using a cutting wheel, thereby providing individual electronic devices 10. Accordingly, sides of encapsulant 13 and substrate 11 can be coplanar.

FIG. 4N shows a cross-sectional view of electronic device 10 at a later stage of manufacture. In the example shown in FIG. 4N, individual electronic devices 10 can be coupled to external substrate 185. In some examples, external interconnects 17 of each electronic device 10 can be coupled to external substrate 185. The coupling process can be similar to that performed between electronic components 15 and substrate 11. In some examples, underfill 186 (optional) fills spaces between substrate 11 and external substrate 185, and thus external interconnects 17 can be covered by underfill 186. The filling process of underfill 186 can be similar to that performed between electronic components 15 and substrate 11. In some examples, protection walls or wall 187 can be positioned on the top side of external substrate 185, and external terminals 188 can positioned on the bottom side of external substrate 185. In some examples, walls 187 can comprise or be referred to as a stiffener or as an electromagnetic shield. Walls 187 can define a perimeter with one or more electronic devices 10 attached to external substrate 185 at top side within the perimeter as generally illustrated in FIG. 4N.

In some examples, external substrate 185 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process.

FIGS. 5A to 5H shows a cross-sectional view of an example method for manufacturing an example electronic device 10 having two-stage terminals 115. The example method for manufacturing example electronic device 10 shown in FIGS. 5A to 5H is similar to that for manufacturing example electronic device 10 shown in FIGS. 4A to 4N, and thus the following description will focus on differences.

FIG. 5A shows a cross-sectional view of electronic device 10 at an early stage of manufacture. In the example shown in FIG. 5A, after dielectric 1121 is formed on seed layer 181, patterns (openings 1121a) can be formed in dielectric 1121. In some examples, some regions of seed layer 181 can be exposed through openings 1121a of dielectric 1121. In some examples, openings 1121a can have circular, triangular, quadrangular, pentagonal, hexagonal or polygonal shapes when planarly viewed. In some examples, the widths of openings 1121a can range from about 20 µm to about 200 µm. In some examples, one of openings 1121a can correspond to one of substrate outward terminals or two-stage terminals 115 to be formed in a subsequent process. Although three openings 1121a are shown in FIG. 5A, such openings 1121a can be more or fewer than those disclosed herein.

FIG. 5B shows a cross-sectional view of electronic device 10 at a later stage of manufacture. In the example shown in FIG. 5B, conductor 1153 for conductive structure 111 can be formed on regions of seed layer 181 exposed through openings 1121a of dielectric 1121. In some examples, conductor 1153 can be formed on regions of seed layer 181 by electroplating copper. In some examples, conductor 1153 can have a circular, triangular, quadrangular, pentagonal, hexagonal, or polygonal shape when planarly viewed. In some examples, portions of conductor 1153 can define or can be referred to as pad base 1159. In some examples, only the bottom side of pad base 1159 contacts seed layer 181, while its side sides can contact dielectric 1121. In some examples, the line/space/thickness of pad base 1159 can range from about 0.5/0.5/0.5 µm to about 10/10/10 µm. In some examples, the thickness of pad base 1159 can be thinner than that of dielectric 1121. In some examples, the top side of pad base 1159 can be lower than the top side of dielectric 1121.

Figure 5C:
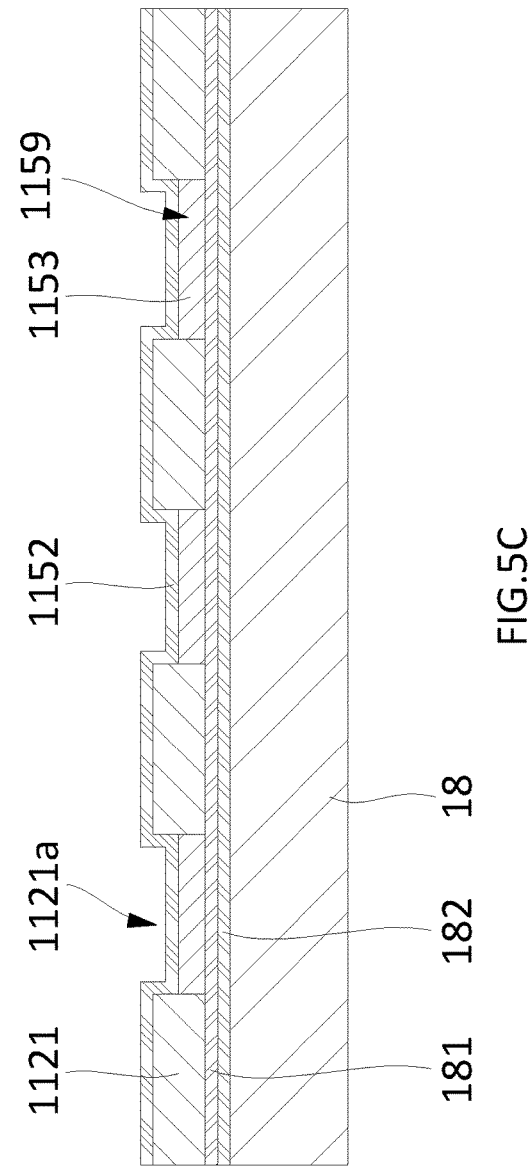

FIG. 5C shows a cross-sectional view of electronic device 10 at a later stage of manufacture. In the example shown in FIG. 5C, seed layer 1152 for conductive structure 111 can be formed on dielectric 1121 and pad base 1159. Since a plurality of openings 1121a exposing pad base 1159 are formed in dielectric 1121, seed layer 1152 can also be formed in openings 1121a. Generally, seed layer 1151 can be formed in a substantially uneven pattern due to the plurality of openings 1121a formed in dielectric 1121 when planarly viewed. The forming process, the material, or the thickness of seed layer 1151 can be similar to those of seed layer 181.

Figure 5D:
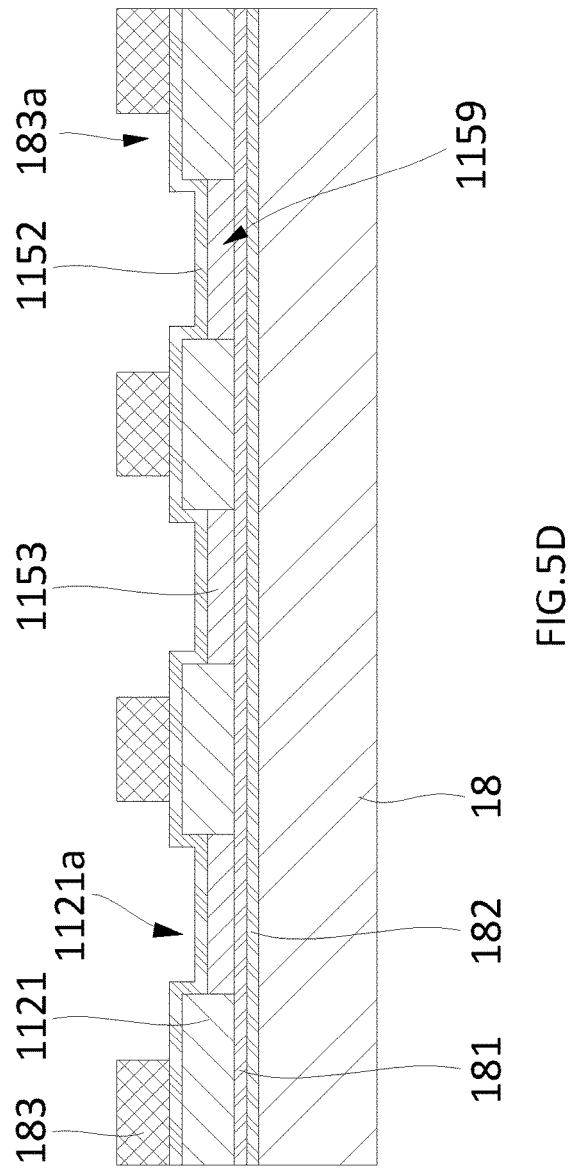

FIG. 5D shows a cross-sectional view of electronic device 10 at a later stage of manufacture. In the example shown in FIG. 5D, photoresist 183 can be provided on seed layer 1152, can be cured, and can be patterned, thereby forming a plurality of photoresist openings 183a. In the example shown in FIG. 5D, multiple photoresist openings 183a can be formed. Accordingly, seed layer 1152 having multiple uneven patterns can be exposed through the multiple photoresist openings 183a. The coating, curing and patterning processes of photoresist 183 can be similar to those described above.

Figure 5E:
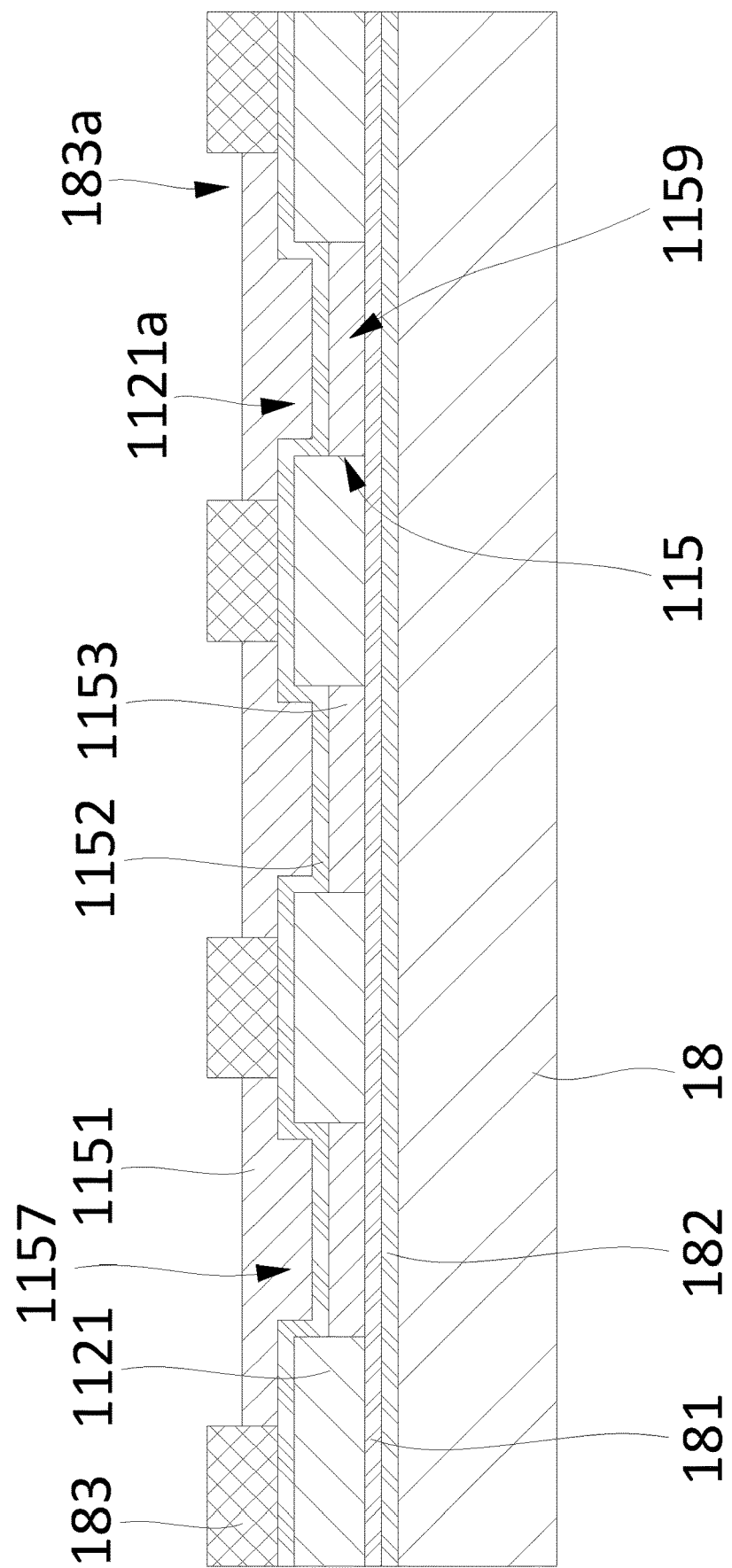

FIG. 5E shows a cross-sectional view of electronic device 10 at a later stage of manufacture. In the example shown in FIG. 5E, conductor 1151 for conductive structure 111 can be formed on seed layer 1152. In some examples, conductor 1151 can be formed on seed layer 1152 having uneven patterns by electroplating copper. In some examples, regions of conductor 1151 in openings 183a, or over openings 1121a of dielectric 1121, can be referred to as pad heads 1157. In some examples, the line/space/thickness of conductor 1151 including pad heads 1157 can range from about 0.5/0.5/0.5 µm to about 10/10/10 µm. In some examples, pad heads 1157 of conductor 1151 can be coupled to previously formed pad base 1159 through seed 1151 or through openings 1121a of dielectric 1121, and peripheral regions of pad head 1157 can be formed over dielectric 1121.

In some examples, pad base 1159 previously formed in openings 1121a of dielectric 1121 and pad heads 1157 later formed in openings 1121a of dielectric 1121, can be referred to as two-stage terminals 115. In some examples, two-stage terminals 115 can also be referred to as substrate outward terminals 115. In some examples, a micro dimple 11510 can be formed on the top side of conductor 1151 or pad head 1157 (see FIGS. 2B and 5F).

In some examples, two-stage terminals 115 can permit the depth of micro dimple 11510 can be about 1/100 to about 1/10 of the depth of the conventional dimple that would otherwise be formed over a conventional pad or terminal. In some examples, the depth of micro dimple 11510 can range from about 0.1 µm to about 2 µm. In some examples, the depth of micro dimple 11510 can be less than about 1 µm. In some examples, the depth of micro dimple 11510 can be less than about 0.5 µm. In some examples, the depth of micro dimple 11510 can be less than about twenty percent (20%) of terminal width 1121w of substrate outward terminal 115 (see FIG. 2B). For instance, if terminal width 1121w is 10 µm, the depth of each of micro dimple 11510 can be less than about 2 µm.

In some examples, two-stage terminals 115 can permit reduction of the thickness of conductor 1151, where the shallower depth of micro dimple 11510 can reduce the need for a thicker conductor 1151 to compensate for the deeper depth of the dimple that would otherwise be formed in a conventional pad. Therefore, cracking of conductive structure 111 around pad edges can be suppressed, or the thickness of conductive structure 111 can be reduced due to the suppressed likelihood of cracking.

External interconnects 17 can be subsequently connected to two-stage terminals or substrate outward terminals 115. In the example shown in FIG. 5E, three two-stage terminals or three substrate outward terminals 115 are shown, which is, however, simplified for a better understanding of the present disclosure. In practice, several tens to several thousands of two-stage terminals or substrate outward terminals 215 can be formed.

Figure 5F:
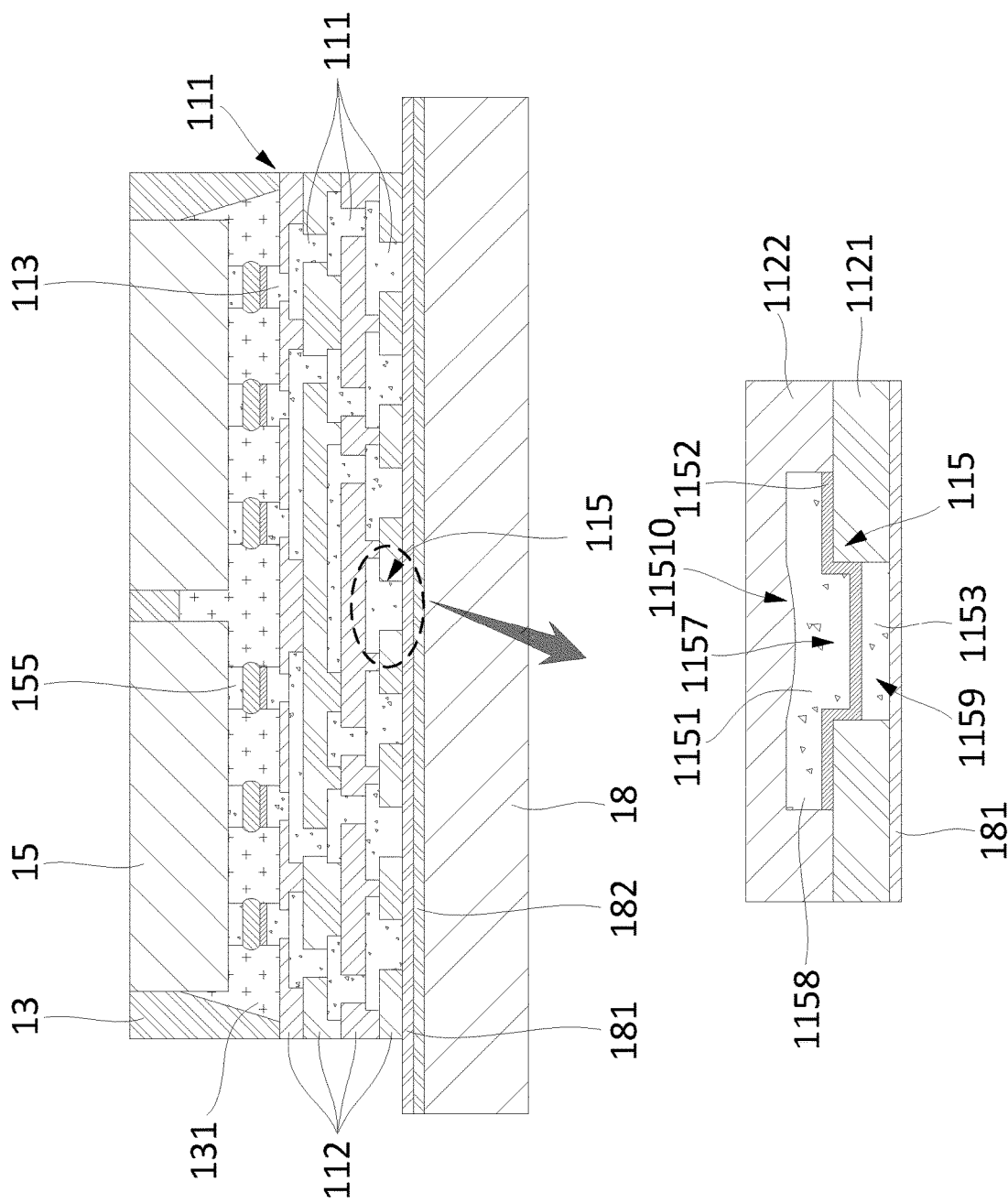

FIG. 5F shows a cross-sectional view of electronic device 10 at a later stage of manufacture. In the example shown in FIG. 5F, processes similar to those described for FIGS. 4H-4J can performed. In some examples, seed layer 181 can still exist on the bottom side of pad base 1159 and the bottom side of dielectric 1121.

FIG. 5G shows a cross-sectional view of electronic device 10 at a later stage of manufacture. In the example shown in FIG. 5G, carrier 18 can be removed from substrate 11. In some examples, seed layer 181 can be etched and removed from substrate outward terminals 215 or dielectric 1121 provided on substrate 11. In some examples, the bottom side of pad base 1159 can be exposed through dielectric 1121, or the bottom side of pad base 1159 and the bottom side of dielectric 1121 can be substantially coplanar.

Figure 5H:
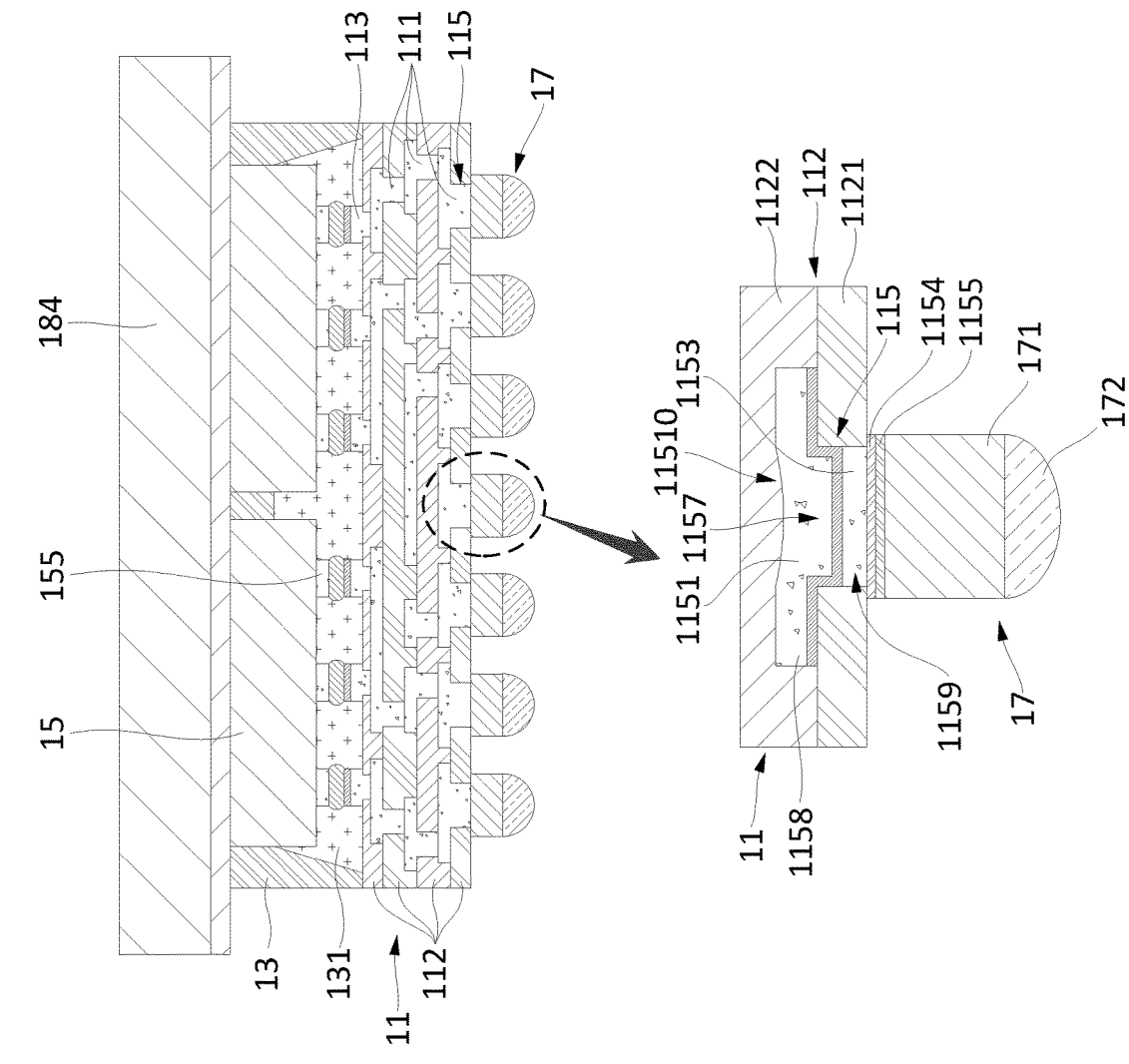

FIG. 5H shows a cross-sectional view of electronic device 10 at a later stage of manufacture. In the example shown in FIG. 5H, external interconnects 17 can be provided. In some examples, seed layer 1154 can be formed on the bottom side of substrate 11. Seed layer 1154 can be coupled to pad base 1159. The forming process and the material of seed layer 1154 can be similar to those of seed layer 181 or 1152. Photoresist can be coated on seed layer 1154 and can then be patterned. By the patterning of the photoresist, openings can be formed, and some regions of seed layer 1154 (regions corresponding to substrate outward terminals 115) can be exposed through the openings. External interconnects 17 can be provided on exposed seed layer 1154. In some examples, pad contacts 1155 can be formed on seed layer 1154, and external interconnects 17 can be provided on pad contacts 1155.

As described above, electronic device 10 according to the present disclosure includes substrate outward terminals 215/115, such as multi-via terminals or two-stage terminals, thereby markedly reducing the depths of dimples in a conductive structure such as, for example, a redistribution layer, compared to the prior art. In addition, as the depths of dimples are reduced, the likelihood of the conductive structure being cracked due to thermal or mechanical stress can be markedly reduced, compared to the prior art.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A method of manufacturing a semiconductor device, comprising:
   providing a substrate comprising:
      a first side;
      a second side opposite to the first side;
      a conductive structure comprising a substrate inward terminal at the first side and a substrate outward terminal at the second side, and
      a dielectric structure comprising a first dielectric comprising a first opening at the second side;
      wherein:
         the substrate outward terminal comprises:
            a multi-stage terminal comprising:
               a pad base within the first opening comprising a pad base top side recessed below an upper surface the first dielectric and a pad base bottom side opposite the pad base top side;
               a pad head coupled to the pad base within the first opening, the pad head comprising a pad head top side and a pad head bottom side that is coupled to the pad base top side within the first opening;
               the pad head top side external to the first opening; and
               the pad base and the pad head are separate and distinct structures;
   providing a semiconductor component at the first side of the substrate and electrically coupled to the substrate inward terminal; and
   providing an encapsulant encapsulating the semiconductor component.

2. The method of claim 1, wherein:
   providing the substrate comprises:
      providing the first dielectric as an outermost dielectric of the dielectric structure;
      providing the first dielectric comprises comprising an inner side and an outer side opposite to the inner side that defines the second side of the substrate; and
      providing the pad base bottom side substantially coplanar with the outer side of the first dielectric.

3. The method of claim 1, wherein:
   providing the first opening comprises providing the first opening with a width in a cross-sectional view;
   providing the substrate comprises providing the pad base extending across the width; and
   providing the substrate comprises providing the pad head comprising peripheral regions overlying the first dielectric.

4. The method of claim 3, further comprising:
   providing an external interconnect coupled to the pad base at the second side of the substrate.

5. The method of claim 4, further comprising:
   providing a pad contact interposed between the pad base and the external interconnect;
   wherein:
      the pad contact overlaps the first dielectric.

6. The method of claim 3, wherein:
   providing the substrate comprises:
      providing a seed interposed between the pad base and the pad head; and
      providing the pad head top side comprises providing the pad head top side with a micro-dimple comprising a maximum depth of about 1 µm or less.

7. The method of claim 1, wherein:
   providing the substrate comprises:
      providing a trace extending from the pad head; and
      providing a second dielectric covering the multi-stage terminal.

8. The method of claim 1, further comprising:
   providing an underfill interposed between the first side of the substrate and the semiconductor component;
   wherein:
   providing the substrate comprises:
      providing a coreless substrate;
      providing the substrate inward terminal protruding from the first side of the substrate; and
      providing the dielectric structure comprising a plurality of dielectric layers; and
   providing the semiconductor component comprises providing the semiconductor component comprising a component terminal attached to the substrate inward terminal.

9. The method of claim 1, further comprising:
   providing an external substrate comprising an external substrate top side and a wall positioned at the external substrate top side, wherein the wall defining a perimeter, and wherein the wall comprises one or more of a stiffener or an electromagnetic shield; and
   attaching the semiconductor device to the external substrate top side within the perimeter.

10. A method of manufacturing a semiconductor device, comprising:
    providing a substrate comprising:
       a first side;
       a second side opposite to the first side;
       a substrate inward terminal at the first side;
       a multi-via terminal at the second side; and
       a dielectric structure comprising a first dielectric comprising a first opening at the second side;
       wherein:
          the multi-via terminal comprises:
             a pad dielectric within the first opening; and
             a conductor comprising:
                a plurality of pad conductive vias within the first opening, the plurality of pad conductive vias comprising individual conductive pillars; and
                a conductor top side that overlaps the pad dielectric and comprises a micro dimple above each of the plurality of pad conductive vias; and
             the pad dielectric comprises a continuous dielectric interposed between the individual conductive pillars;
    providing a semiconductor component coupled to the substrate inward terminal; and
    providing an encapsulant encapsulating at least part of the semiconductor component.

11. The method of claim 10, wherein:
    providing the substrate comprises providing the multi-via terminal comprising a terminal width within the first dielectric; and a maximum micro dimple depth is less than about twenty percent (20%) of the terminal width.

12. The method of claim 10, further comprising:
providing an external interconnect coupled to the plurality of pad conductive vias at the second side of the substrate,
wherein:
providing the substrate comprises:
   providing the first dielectric as an outermost dielectric of the dielectric structure;
   providing a trace extending from the plurality of pad conductive vias; and
   providing a second dielectric covering the multi-via terminal.

13. The method of claim 10, wherein:
each micro dimple comprises a maximum depth of about 0.5 μm or less.

14. The method of claim 10, further comprising:
providing an external interconnect coupled to the plurality of pad conductive vias at the second side of the substrate; and
providing a pad contact interposed between the plurality of pad conductive vias and the external interconnect.

15. A method of manufacturing a semiconductor device, comprising:
providing a substrate comprising:
   a first side;
   a second side opposite to the first side;
   a conductive structure comprising a substrate inward terminal at the first side and a substrate outward terminal at the second side; and
   a dielectric structure comprising a first dielectric comprising a first opening at the second side;
providing a semiconductor component at the first side of the substrate and coupled to the substrate inward terminal; and
providing an encapsulant encapsulating at least part of the semiconductor component,
wherein:
the substrate outward terminal comprises:
   a multi-via terminal comprising:
      a pad conductive via within the first opening and comprising a portion of a conductor; and
      a pad dielectric via adjacent to the pad conductive via within the first opening; wherein:
         the conductor comprises a conductor top side, the conductor top side comprising one or more micro dimples above the pad conductive via on opposing sides of the pad dielectric via in a cross-sectional view;
         the pad conductive via is among a plurality of pad conductive vias within the first opening, each of the plurality of pad conductive vias comprising a respective portion of the conductor;
         the plurality of pad conductive vias are individual conductive pillars; and
         the pad dielectric via is continuous dielectric interposed between the individual conductive pillars.

16. The method of claim 15, wherein providing the substrate comprises:
providing a trace extending from the plurality of pad conductive vias.

17. The method of claim 15, further comprising:
providing a second dielectric covering the multi-via terminal.

18. The method of claim 15, further comprising:
providing an external interconnect coupled to the plurality of pad conductive vias at the second side of the substrate.

19. The method of claim 18, further comprising:
providing a pad contact interposed between the plurality of pad conductive vias and the external interconnect;
wherein:
the pad contact overlaps the first dielectric.

20. The method of claim 15, wherein:
providing the substrate comprises providing a seed between the pad dielectric via and the conductor.

* * * * *